US012757426B2

(12) United States Patent
Zhao et al.

(10) Patent No.: US 12,757,426 B2
(45) Date of Patent: *Oct. 6, 2026

(54) NITRIDE-BASED BIDIRECTIONAL SWITCHING DEVICE AND METHOD FOR MANUFACTURING THE SAME

(71) Applicant: INNOSCIENCE (SUZHOU) SEMICONDUCTOR CO., LTD., Suzhou City (CN)

(72) Inventors: Qiyue Zhao, Suzhou City (CN); Wuhao Gao, Suzhou City (CN); Tianheng Xian, Suzhou City (CN)

(73) Assignee: INNOSCIENCE (SUZHOU) SEMICONDUCTOR CO., LTD., Suzhou City (CN)

( * ) Notice: Subject to any disclaimer, the term of this patent is extended or adjusted under 35 U.S.C. 154(b) by 1257 days.

This patent is subject to a terminal disclaimer.

(21) Appl. No.: 17/639,335

(22) PCT Filed: Dec. 31, 2021

(86) PCT No.: PCT/CN2021/143702

§ 371 (c)(1),
(2) Date: Feb. 28, 2022

(87) PCT Pub. No.: WO2023/123363

PCT Pub. Date: Jul. 6, 2023

(65) Prior Publication Data

US 2024/0047568 A1 Feb. 8, 2024

(51) Int. Cl.

*H01L 29/778* (2006.01)
*H01M 10/42* (2006.01)
(Continued)

(52) U.S. Cl.

CPC ........ *H10D 30/475* (2025.01); *H01M 10/425* (2013.01); *H10D 30/015* (2025.01);
(Continued)

(58) Field of Classification Search

CPC ............... H10D 30/475; H10D 30/015; H10D 62/8503; H10D 64/112; H10D 64/411;
(Continued)

(56) References Cited

U.S. PATENT DOCUMENTS 9,865,724 B1 1/2018 Morizuka
2005/0189561 A1 9/2005 Kinzer et al.
(Continued)

FOREIGN PATENT DOCUMENTS

CN 102683405 A 9/2012
CN 102881725 A 1/2013
(Continued)

OTHER PUBLICATIONS

International Search Report and Written Opinion of corresponding PCT application No. PCT/CN2021/143702 mailed on Aug. 5, 2022.
(Continued)

*Primary Examiner* — Mohammed R Alam

(74) *Attorney, Agent, or Firm* — Li & Cai Intellectual Property (USA) Office

(57) ABSTRACT

A nitride-based bidirectional switching device is for working with a battery protection controller having a power input terminal, a discharge over-current protection (DO) terminal, a charge over-current protection (CO) terminal, a voltage monitoring (VM) terminal and a ground terminal. The nitride-based bidirectional switching device includes a dual gate transistor. The dual gate transistor includes a first and a second source electrodes and a first and a second gate structures. The first source electrode is configured for electrically connecting to a ground terminal of the battery protection controller. The second source electrode is configured for connecting to the VM terminal of the controller through a voltage monitoring resistor. The first gate structure is configured for electrically connecting to the DO terminal
(Continued)

of the battery protection controller. The second gate structure is configured for electrically connecting to the CO terminal of the battery protection controller.

16 Claims, 16 Drawing Sheets

(51) Int. Cl.

| | |
|---|---|
| ***H10D 30/01*** | (2025.01) |
| ***H10D 30/47*** | (2025.01) |
| ***H10D 62/85*** | (2025.01) |
| ***H10D 64/00*** | (2025.01) |
| ***H10D 64/27*** | (2025.01) |
| ***H10W 74/10*** | (2026.01) |

(52) U.S. Cl.
CPC ....... *H10D 62/8503* (2025.01); *H10D 64/112* (2025.01); *H10D 64/411* (2025.01); *H10W 74/137* (2026.01); *H10W 74/147* (2026.01); *H01M 2010/4271* (2013.01)

(58) Field of Classification Search
CPC ............. H10D 62/343; H10D 30/4755; H10D 64/511; H01M 10/425; H01M 2010/4271; H01M 10/42; H01M 6/50; H10W 74/137; H10W 74/147; H02J 7/62; Y02E 60/10
See application file for complete search history.

(56) References Cited

U.S. PATENT DOCUMENTS

| | | | | |
|---|---|---|---|---|
| 2005/0253168 | A1* | 11/2005 | Wu | H10D 64/112 257/E29.253 |
| 2007/0120758 | A1 | 5/2007 | Takahashi | |
| 2009/0065810 | A1 | 3/2009 | Honea et al. | |
| 2012/0194276 | A1 | 8/2012 | Fisher | |
| 2012/0228675 | A1 | 9/2012 | Heikman et al. | |
| 2017/0338337 | A1* | 11/2017 | Bobde | H10D 62/115 |
| 2019/0006499 | A1 | 1/2019 | Kinoshita et al. | |

FOREIGN PATENT DOCUMENTS

| | | | | |
|---|---|---|---|---|
| CN | 107403800 A | | 11/2017 | |
| CN | 107611089 A | | 1/2018 | |
| CN | 112420825 A | | 2/2021 | |
| CN | 113016074 A | * | 6/2021 | H01L 23/3192 |
| CN | 113396541 A | | 9/2021 | |
| CN | 113519064 A | | 10/2021 | |
| EP | 2747142 A1 | | 6/2014 | |
| JP | 2007526633 A | | 9/2007 | |
| JP | 2011244459 A | | 12/2011 | |
| TW | 201511261 A | | 3/2015 | |
| TW | 201826534 A | | 7/2018 | |
| WO | 2012026134 A1 | | 3/2012 | |
| WO | WO 2017159559 A1 | | 9/2017 | |
| WO | WO-2022174400 A1 | * | 8/2022 | H01L 23/3192 |

OTHER PUBLICATIONS

First Office Action of corresponding Taiwan patent application No. 111101875 mailed on Dec. 12, 2022.
Xing H et al:"HIGH Breakdown Voltage AlGaN-GaN HEMTS Achieved by Multiple Field Plates", XP001190361, IEEE Electron Device Letters, IEEE, USA, vol. 25, No. 4, Apr. 1, 2004 (Apr. 1, 2004), 3 pages.
European Patent Office, Extended European Search Report Issued in Application No. 21859333.3, Dec. 12, 2023, Germany, 13 pages.
Japanese Patent Office, Office Action Issued in Application No. 2022-513933, Feb. 9, 2024, 9 pages. (Submitted with Machine Translation).

* cited by examiner

NITRIDE-BASED BIDIRECTIONAL SWITCHING DEVICE AND METHOD FOR MANUFACTURING THE SAME

FIELD OF THE DISCLOSURE

The present invention generally relates to a nitride-based semiconductor device. More specifically, the present invention relates to a nitride-based bidirectional switching device including a dual gate transistor so as to be brought to a condition suitable for working with a battery protection controller Background of the Disclosure:

In recent years, intense research on high-electron-mobility transistors (HEMTs) has been prevalent, particularly for high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE DISCLOSURE

In accordance with one aspect of the present disclosure, a nitride-based semiconductor device is provided. The nitride-based bidirectional switching device is for working with a battery protection controller having a power input terminal, a discharge over-current protection (DO) terminal, a charge over-current protection (CO) terminal, a voltage monitoring (VM) terminal and a ground terminal. The nitride-based bidirectional switching device includes a nitride-based active layer, a nitride-based barrier layer, a plurality of spacer layers, and a dual gate transistor. The nitride-based active layer is disposed on a substrate. The nitride-based barrier layer is disposed on the nitride-based active layer and has a bandgap greater than a bandgap of the nitride-based active layer. The spacer layers are disposed above the nitride-based barrier layer and includes at least a first spacer layer and a second spacer layer disposed above the first spacer layer. The dual gate transistor includes a first and a second source electrodes and a first and a second gate structures. The first and second source electrodes are disposed on the plurality of spacer layers. The first source electrode is configured for electrically connecting to a ground terminal of the battery protection controller. The second source electrode is configured for connecting to the VM terminal of the controller through a voltage monitoring resistor. The first and the second gate structures are disposed on the nitride-based barrier layer and laterally between the first and second source electrodes. The first gate structure includes a first gate electrode configured for electrically connecting to the DO terminal of the battery protection controller. The second gate structure includes a second gate electrode configured for electrically connecting to the CO terminal of the battery protection controller.

In accordance with one aspect of the present disclosure, a method for manufacturing a nitride-based bidirectional switching device is provided. The method includes step as follow. A nitride-based active layer is formed over a substrate. A nitride-based barrier layer having a bandgap greater than a bandgap of the nitride-based active layer is formed on the nitride-based active layer. A first and a second gate electrodes is formed over the nitride-based barrier layer. A first passivation layer is formed on the second nitride-based semiconductor layer to cover the first and second gate electrodes. A lower blanket field plate is formed on the first passivation layer. The lower blanket field plate is patterned to respectively form a first and a second lower field plates above the first and second gate electrodes using a wet etching process. A second passivation layer is formed on the first passivation layer to cover the first and second lower field plates. An upper blanket field plate is formed on the second passivation layer. The upper blanket field plate is patterned to respectively form a first and a second upper field plates above the first and second lower field plates using a dry etching process.

In accordance with one aspect of the present disclosure, a nitride-based semiconductor device is provided. The nitride-based bidirectional switching device is for working with a battery protection controller having a power input terminal, a discharge over-current protection (DO) terminal, a charge over-current protection (CO) terminal, a voltage monitoring (VM) terminal and a ground terminal. The nitride-based bidirectional switching device includes a nitride-based active layer, a nitride-based barrier layer, and a dual gate transistor. The nitride-based barrier layer is disposed on the nitride-based active layer and has a bandgap greater than a bandgap of the nitride-based active layer. The dual gate transistor includes a first source electrode, a second source electrode, a first gate electrode, a second gate electrode, a first lower field plate, a second lower field plate, a first upper field plate, and a second upper field plate. The first source electrode electrically connects to a ground terminal of the battery protection controller. The second source electrode is configured for connecting to the VM terminal of the controller through a voltage monitoring resistor. The first gate electrode is configured for electrically connecting to the DO terminal of the battery protection controller. The second gate electrode is configured for electrically connecting to the CO terminal of the battery protection controller. The first lower field plate is disposed over the first gate electrode. The second lower field plate is disposed over the second gate electrode. The first upper field plate is disposed over the first lower field plate. The second upper field plate is disposed over the second lower field plate. A distance from the first upper field plate to the second upper field plate is less than a distance from the first lower field plate to the second lower field plate.

As such, a distance from the first upper field plate to the second upper field plate is less than a distance from the first lower field plate to the second lower field plate. The configuration of the field plates serves as a factor for the improvement of the withstand voltage. When the bidirectional switching device is at the turned off status, whether breakdown occurs at the region between the gate structures is related to electrical field distribution there. This is due to no other conductive element formed between the gate structures, so the configuration of the field plates is highly related to control of the turned off status. The configuration of the field plates of the present disclosure can let the turned off status stable, so the nitride-based bidirectional switching device can work with the battery protection controller well.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 2:
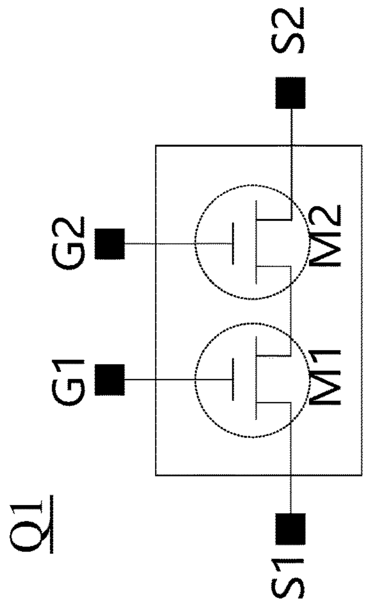
FIG. 2 is an equivalent circuit diagram of a nitride-based bidirectional switching device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1:
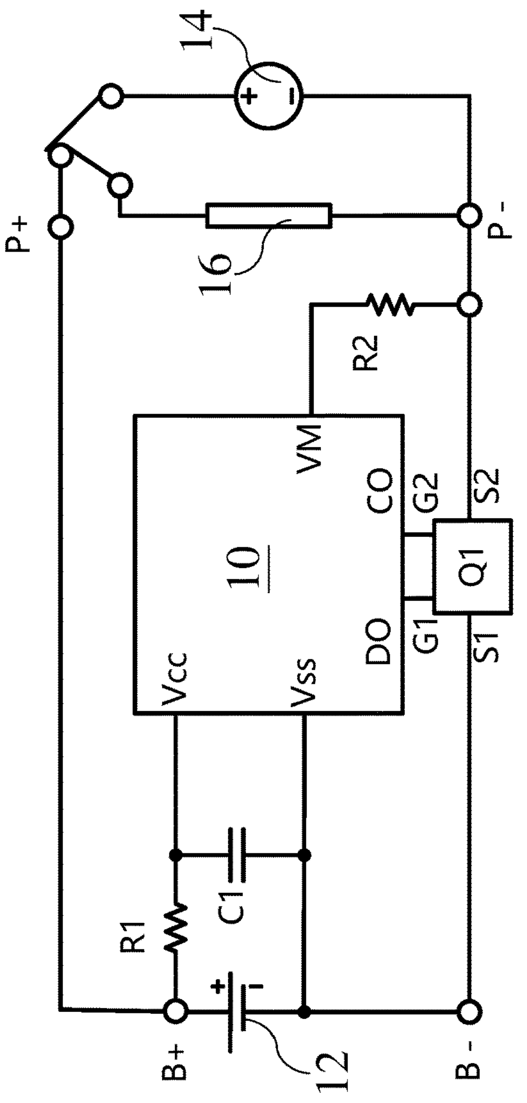
FIG. 1 is a circuit diagram of a nitride-based bidirectional switching device for working with a battery protection controller according to some embodiments of the present disclosure.

FIG. 1 is a circuit diagram of a nitride-based bidirectional switching device Q1 for working with a battery protection controller 10 according to some embodiments of the present disclosure. FIG. 2 is an equivalent circuit diagram of a nitride-based bidirectional switching device Q1 according to some embodiments of the present disclosure. A battery 12 is electrically coupled with the battery protection controller 10. A capacitor C1 and a resistor R1 can connected between the battery 12 and the battery protection controller 10 to modulate signals therebetween. A charger 14 can be electrically coupled into the circuit. A resistor R2 can be connected between the charger 14 and the battery protection controller 10 to modulate signals therebetween. The nitride-based bidirectional switching device Q1 is electrically coupled with the battery protection controller 10.

The nitride-based bidirectional switching device Q1 can be configured to provide bidirectional turned on and bidirectional turned off in the circuit. During a charging operation, a current can flow from a positive pole P+ of the charger 14 to a positive pole B+ of the battery 12. During a discharging operation, a current can flow from a positive pole B+ of the battery 12 to a load 16.

The battery protection controller 10 has a power input terminal Vcc, a ground terminal Vss, a discharge over-current protection terminal DO, a charge over-current protection terminal CO, and a voltage monitoring terminal VM. Since there two output ports, the discharge over-current protection terminal DO and the charge over-current protection terminal CO, a specific switch is required for controlling between the charging operation and the discharging operation.

The bidirectional switching device Q1 has source electrodes S1 and S2 and gate electrodes G1 and G2. The source electrode S1 is configured for electrically connecting to the ground terminal Vss of the battery protection controller 10.

The source electrode S2 is configured for connecting to the voltage monitoring terminal VM of the battery protection controller 10 through the R2. The resistor R2 can serve as a voltage monitoring resistor. The gate electrode G1 is configured for electrically connecting to the discharge over-current protection terminal DO of the battery protection controller 10. The gate electrode G2 is configured for electrically connecting to the charge over-current protection terminal CO of the battery protection controller 10.

Referring to FIG. 2, the bidirectional switching device Q1 includes a dual gate transistor. The dual gate transistor can be achieved by a pair of nitride-based transistor elements M1 and M2 connected in series. The nitride-based transistor element M1 includes the source electrode S1 and the gate electrode G1. The nitride-based transistor element M2 includes the source electrode S2 and the gate electrode G2.

At a condition that any one of the gate electrodes G1 and G2 is cut off, the corresponding nitride-based transistor M1 or M2 is turned off such that a charging operation or a discharging operation can be terminated. At such the status, the bidirectional switching device Q1 can include at least one turned off transistor element therein so can act as a withstand voltage structure. How a degree of a withstand voltage provided by the bidirectional switching device Q1 is depends on the performance of the bidirectional switching device Q1.

For example, at a case that a withstand voltage provided by a bidirectional switching device is sufficient, the terminated to that a charging operation or a discharging operation is smooth. However, at a case that a withstand voltage provided by a bidirectional switching device is poor, the terminated to that of a charging operation or a discharging operation might fail. In this regard, the poor withstand voltage may result from breakdown in the bidirectional switching device.

Furthermore, when a charging operation or a discharging operation is performed, the bidirectional switching device Q1 can achieve low voltage drop. One of the reasons is that the nitride-based transistor elements M1 and M2 can have low on-state resistance. The low voltage drop can bring the load 16 into the operated condition as designed. The present disclosure is to provide a bidirectional switching device having an improved withstand voltage so as to suitably work in combination with a battery protection controller in a circuit.

Figure 3A:
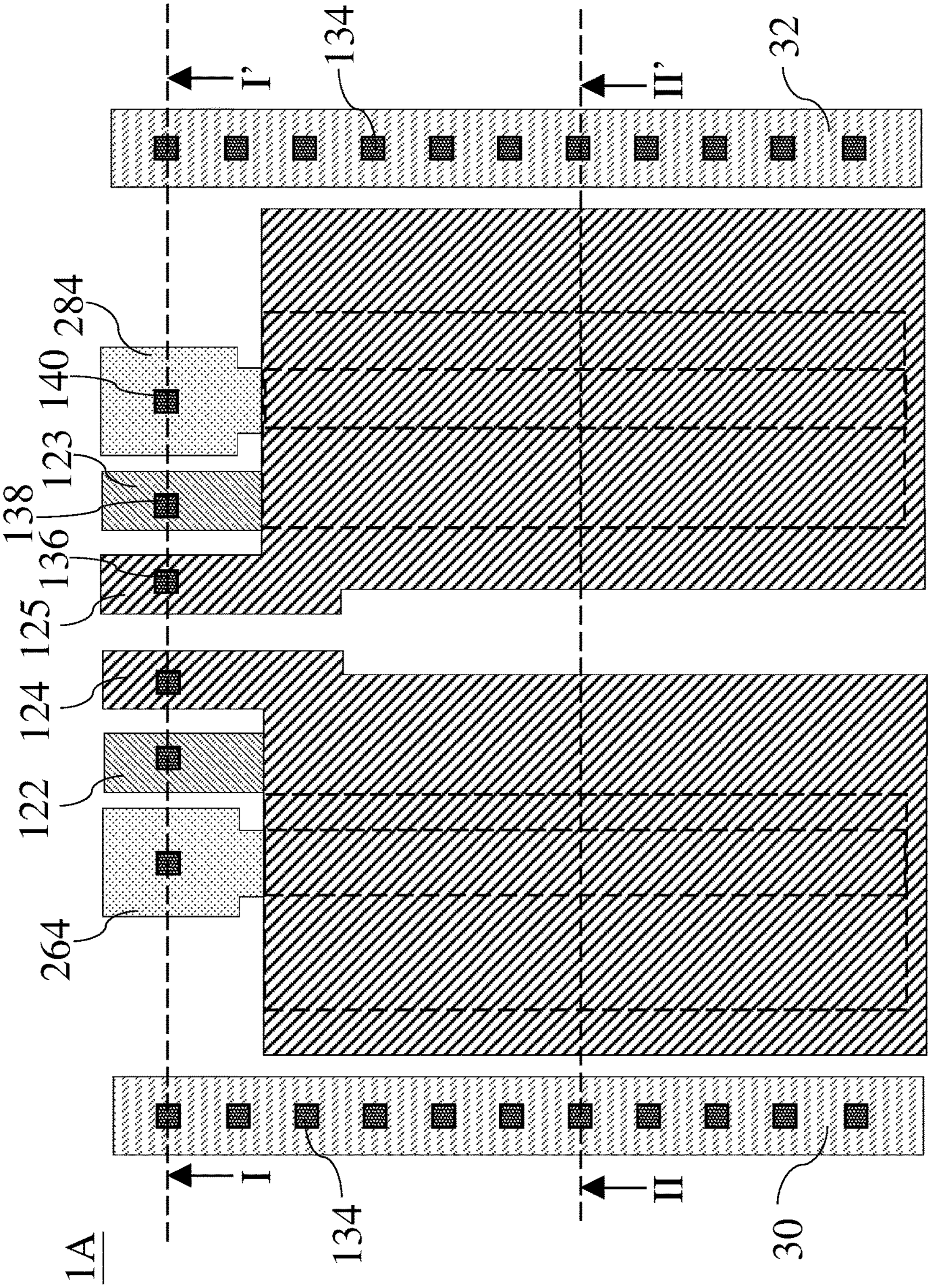
FIG. 3A is a layout of a bidirectional switching device according to some embodiments of the present disclosure.

FIG. 3A is a layout of a bidirectional switching device 1A according to some embodiments of the present disclosure. The layout shows a relationship among gate electrodes 264 and 284, field plates 122 and 124, and source electrodes 30 and 32 of the bidirectional switching device 1A. These elements can constitute a dual gate transistor in the bidirectional switching device 1A. The layout reflects a top view of the bidirectional switching device 1A, which means the layout reflects the gate electrodes 264 and 284, the field plates 122, 123, 124, and 125, and the source electrodes 30 and 32 are formed as layers and viewed along a direction normal to these layers. More structural details of the bidirectional switching device 1A are provided as follows.

Figure 3B:
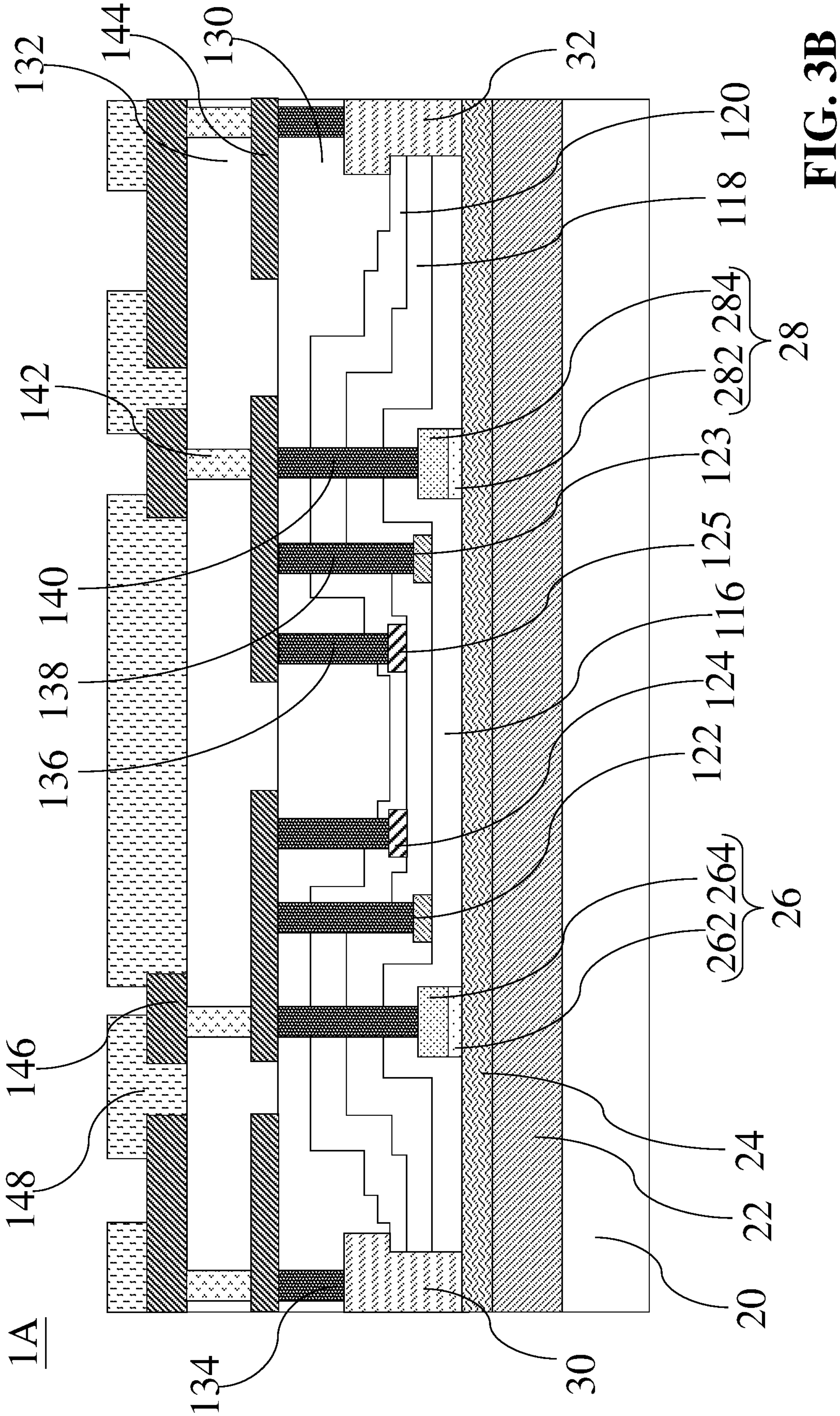
FIGS. 3B and 3C are cross-sectional views across a line I-I' and a line II-II' of the bidirectional switching device in FIG. 3A.
Figure 3C:
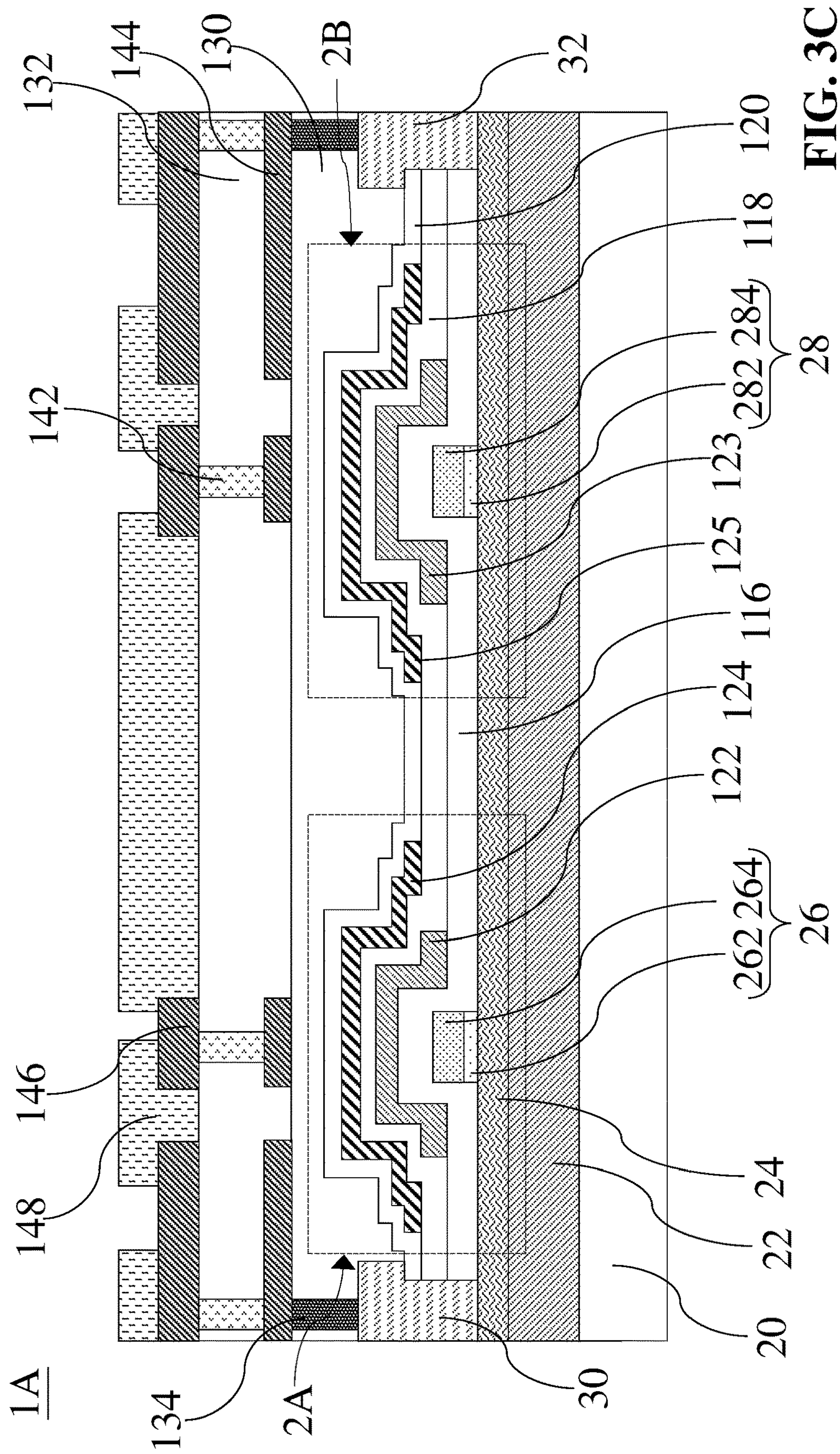

To illustrate, FIGS. 3B and 3C are cross-sectional views across a line I-I' and a line II-II' of the bidirectional switching device 1A in FIG. 3A. The bidirectional switching device 1A further includes a substrate 20, nitride-based semiconductor layers 22 and 24, gate structures 26 and 28, spacer layers 116, 118, 120, 130, 132, vias 134, 136, 138, 140, 142, patterned conductive layers 144, 146, and a protection layer 148.

The substrate 20 may be a semiconductor substrate. The exemplary materials of the substrate 20 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 20 can include, for example, but is not limited to, group III elements, group IV elements, group V elements, or combinations thereof (e.g., III-V compounds). In other embodiments, the substrate 20 can include, for example but is not limited to, one or more other features, such as a doped region, a buried layer, an epitaxial (epi) layer, or combinations thereof.

The nitride-based semiconductor layer 22 is disposed over the substrate 20. The exemplary materials of the nitride-based semiconductor layer 22 can include, for example but are not limited to, nitrides or group III-V compounds, such as GaN, AlN, InN, $InxAlyGa_{(1-x-y)}N$ where $x+y\leq 1$, $AlyGa_{(1-y)}N$ where $y\leq 1$. The nitride-based semiconductor layer 24 is disposed on the nitride-based semiconductor layer 22. The exemplary materials of the nitride-based semiconductor layer 24 can include, for example but are not limited to, nitrides or group III-V compounds, such as GaN, AlN, InN, $InxAlyGa_{(1-x-y)}N$ where $x+y\leq 1$, $AlyGa_{(1-y)}N$ where $y\leq 1$.

The exemplary materials of the nitride-based semiconductor layers 22 and 24 are selected such that the nitride-based semiconductor layer 24 has a bandgap (i.e., forbidden band width) greater than a bandgap of the nitride-based semiconductor layer 22, which causes electron affinities thereof different from each other and forms a heterojunction therebetween. For example, when the nitride-based semiconductor layer 22 is an undoped GaN layer having a bandgap of approximately 3.4 eV, the nitride-based semiconductor layer 24 can be selected as an AlGaN layer having bandgap of approximately 4.0 eV. As such, the nitride-based semiconductor layers 22 and 24 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the bidirectional switching device 1A is available to include at least one GaN-based high-electron-mobility transistor (HEMT).

In some embodiments, the bidirectional switching device 1A may further include a buffer layer, a nucleation layer, or a combination thereof (not illustrated). The buffer layer can be disposed between the substrate 20 and the nitride-based semiconductor layer 22. The buffer layer can be configured to reduce lattice and thermal mismatches between the substrate 20 and the nitride-based semiconductor layer 22, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof. The nucleation layer may be formed between the substrate 20 and the buffer layer. The nucleation layer can be configured to provide a transition to accommodate a mismatch/difference between the substrate 20 and a III-nitride layer of the buffer layer. The exemplary material of the nucleation layer can include, for example but is not limited to AlN or any of its alloys.

The gate structure 26 is disposed on/over/above the nitride-based semiconductor layer 24. The gate structure 26 may include an optional p-type doped III-V compound semiconductor layer 262 and the gate electrode 264 which is mentioned in FIG. 3A. The p-type doped III-V compound semiconductor layer 262 and the gate electrode 264 are stacked on the nitride-based semiconductor layer 24. The p-type doped III-V compound semiconductor layer 262 is located between the nitride-based semiconductor layer 24 and the gate electrode 264. In some embodiments, the gate structure 26 may further include an optional dielectric layer (not illustrated) between the p-type doped III-V compound semiconductor layer 262 and the gate electrode 264.

The gate structure 28 is disposed on/over/above the nitride-based semiconductor layer 24. The gate structure 28 may include an optional p-type doped III-V compound semiconductor layer 282 and the gate electrode 284 which is mentioned in FIG. 3A. The configuration of the gate structure 26 can be applied to the gate structure 28.

In the exemplary illustration of the present embodiment, the bidirectional switching device 1A is an enhancement mode device, which is in a normally-off state when the gate electrodes 264 and 284 are at approximately zero bias. Specifically, the p-type doped III-V compound semiconductor layers 262 and 282 may create at least one p-n junction with the nitride-based semiconductor layer 24 to deplete the 2DEG region, such that at least one zone of the 2DEG region corresponding to a position below the corresponding gate structures 26 and 28 has different characteristics (e.g., different electron concentrations) than the rest of the 2DEG region and thus is blocked.

Due to such mechanism, the bidirectional switching device 1A has a normally-off characteristic. In other words, when no voltage is applied to the gate electrodes 264 and 284 or a voltage applied to the gate electrodes 264 and 284 is less than a threshold voltage (i.e., a minimum voltage required to form an inversion layer below the gate structures 26 and 28), the zone of the 2DEG region below the gate structure 26 or 28 is kept blocked, and thus no current flows therethrough. Moreover, by providing the p-type doped III-V compound semiconductor layers 262 and 282, gate leakage current is reduced and an increase in the threshold voltage during the off-state is achieved.

The exemplary materials of the p-type doped III-V compound semiconductor layers 262 and 282 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

In some embodiments, the nitride-based semiconductor layer 22 includes undoped GaN and the nitride-based semiconductor layer 24 includes AlGaN, and the p-type doped III-V compound semiconductor layers 262 and 282 are p-type GaN layers which can bend the underlying band structure upwards and to deplete the corresponding zone of the 2DEG region, so as to place the bidirectional switching device 1A into an off-state condition.

In some embodiments, the gate electrodes 262 and 284 may include metals or metal compounds. The gate electrodes 262 and 284 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 262 and 284 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a SiOx layer, a SiNx layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The source electrodes 30 and 32 are disposed on the nitride-based semiconductor layer 24. The source electrodes 30 and 32 can be located at two opposite sides of the gate structures 26 and 28. The gate structures 26 and 28 are located between the source electrodes 30 and 32. Each of the gate structures 26 and 28 is laterally located between the source electrodes 30 and 32. The gate structures 26 and 28 and the source electrodes 30 and 32 can collectively act as a dual gate transistor with the 2DEG region, which can be called a nitride-based/GaN-based dual gate transistor as well.

In the exemplary illustration of the present embodiment, the source electrodes 30 and 32 are symmetrical about the gate structures 26 and 28 therebetween. In some embodiments, the source electrodes 30 and 32 can be optionally asymmetrical about the gate structures 26 and 28 therebetween.

In some embodiments, the source electrodes 30 and 32 can include, for example but are not limited to, metals, alloys, doped semiconductor materials (such as doped crystalline silicon), compounds such as silicides and nitrides, other conductor materials, or combinations thereof. The exemplary materials of the source electrodes 30 and 32 can include, for example but are not limited to, Ti, AlSi, TiN, or combinations thereof. The source electrodes 30 and 32 may be a single layer, or plural layers of the same or different composition. In some embodiments, the source electrodes 30 and 32 form ohmic contact with the nitride-based semiconductor layer 24. The ohmic contact can be achieved by applying Ti, Al, or other suitable materials to the source electrodes 30 and 32. In some embodiments, each of the source electrodes 30 and 32 is formed by at least one conformal layer and a conductive filling. The conformal layer can wrap the conductive filling. The exemplary materials of the conformal layer include, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The spacer layers 116, 118, 120, 130, 132 are disposed over the nitride-based semiconductor layer 24. The spacer layers 116, 118, 120 are sequentially stacked on the nitride-based semiconductor layer 24. The spacer layers 116, 118, 120 can be formed for a protection purpose or for enhancing the electrical properties of the device (e.g., by providing an electrically isolation effect between/among different layers/elements). The spacer layer 116 covers a top surface of the nitride-based semiconductor layer 24. The spacer layer 116 may cover the gate structures 26 and 28. The spacer layer 116 can at least cover opposite two sidewalls of the gate structures 26 and 28. The source electrodes 30 and 32 can penetrate/pass through the spacer layers 116, 118, 120 to make contact with the nitride-based semiconductor layer 24.

The exemplary materials of the spacer layers 116, 118, 120 can include, for example but are not limited to, SiNx, SiOx, $Si_3N_4$, SiON, SiC, SiBN, SiCBN, oxides, nitrides, or combinations thereof. In some embodiments, at least one of the spacer layers 116, 118, 120 can be a multi-layered structure, such as a composite dielectric layer of $Al_2O_3/SiN$, $Al_2O_3/SiO_2$, AlN/SiN, $AlN/SiO_2$, or combinations thereof.

The field plates 122, 123, 124, and 125 are disposed over the gate structures 26 and 28. The field plates 122 and 123 are located between the spacer layers 116 and 118. The field plates 124 and 125 are located between the spacer layers 118 and 120. That is, the spacer layer 116, the field plates 122 and 123, the spacer layer 118, the field plates 124 and 125, and the spacer layer 120 are sequentially stacked/formed on the nitride-based semiconductor layer 24. The field plates 122, 123, 124, and 125 are located between the source electrodes 30 and 32. The exemplary materials of the field plates 122, 123, 124, and 125 can include, for example but are not limited to, conductive materials, such as Ti, Ta, TiN, TaN, or combinations thereof. In some embodiments, other conductive materials such as Al, Cu doped Si, and alloys including these materials may also be used.

Referring to FIG. 3C, the field plates 122 and 123 can serve as lower field plates in the bidirectional switching device 1A. The field plate 122 is disposed on the spacer layer 116 and thus is separated from the gate structure 26. The field plate 122 laterally spans at least a part of the gate structure 26. The field plate 122 laterally spans a region which is directly adjacent to the gate structure 26 and between the gate structures 26 and 28. The field plate 123 is disposed on the spacer layer 116 and thus is separated from the gate structure 28. The field plate 123 laterally spans at least a part of the gate structure 28. The field plate 123 laterally spans a region which is directly adjacent to the gate structure 28 and between the gate structures 26 and 28. The field plates 122 and 123 are laterally spaced apart from each other.

The field plates 124 and 125 can serve as higher field plates in the bidirectional switching device 1A. The field plate 124 is disposed on the spacer layer 118 and thus is separated from the field plate 122. The field plate 124 laterally spans at least a part of the field plate 122. The field plate 124 laterally spans a region which is directly adjacent to the field plate 122 and between the field plates 122 and 123. The field plate 125 is disposed on the spacer layer 118 and thus is separated from the field plate 123. The field plate 125 laterally spans at least a part of the field plate 123. The field plate 125 laterally spans a region which is directly adjacent to the field plate 123 and between the field plates 122 and 123. The field plates 124 and 125 are laterally spaced apart from each other.

As such, a distance from the field plate 124 to the field plate 125 is less than a distance from the field plate 122 to the field plate 123. The configuration of the field plates 122, 123, 124, 125 serve as a factor for the improvement of the withstand voltage. When the bidirectional switching device 1A is at the turned off status, whether breakdown occurs at the region between the gate structures 26 and 28 is related to electrical field distribution there. This is due to no other conductive element formed between the gate structures 26 and 28, so the configuration of the field plates 122, 123, 124, 125 is highly related to control of the turned off status.

As the distance from the field plate 124 to the field plate 125 is less than a distance from the field plate 122 to the field plate 123, the electrical field distribution at the region between the gate structures 26 and 28 can be suppressed so as to avoid occurrence of electrical field peak. The electrical field distribution at the region between the gate structures 26 and 28 can become smooth. In this regard, once electrical field distribution gets concentrated and thus a peak is generated in the distribution, breakdown might occur and then result in failure of the turned-off status. To avoid failure of the turned-off status, the field plates 124 and 125 are formed to extend to a region between the field plates 122 and 123.

Furthermore, the process for forming the field plates 122 and 123 can be different than that of the field plates 124 and 125, which is advantageous to the improvement in the electrical character of the bidirectional switching device 1A. One of the reasons is that such the approach can avoid the bidirectional switching device 1A having a configuration turning away from the design thereof.

For example, with respect to a semiconductor device including a stack structure that is formed by a lower spacer layer, a lower field plate, an upper spacer layer, and an upper field plate. The formation of the lower field plate may include patterning a blanket conductive layer to form the lower field plate. However, during the patterning, some portion of the lower spacer layer would be removed (the portions near an upper surface of the lower spacer layer), resulting in a reduced thickness of the lower spacer layer. Accordingly, the upper spacer layer and the upper field plate on the lower spacer layer will be formed at a position lower than the design position due to the reduced thickness of the lower spacer layer. As such, the stability of the semiconductor device is affected and the performance of semiconductor device have reduced.

Figure 4B:
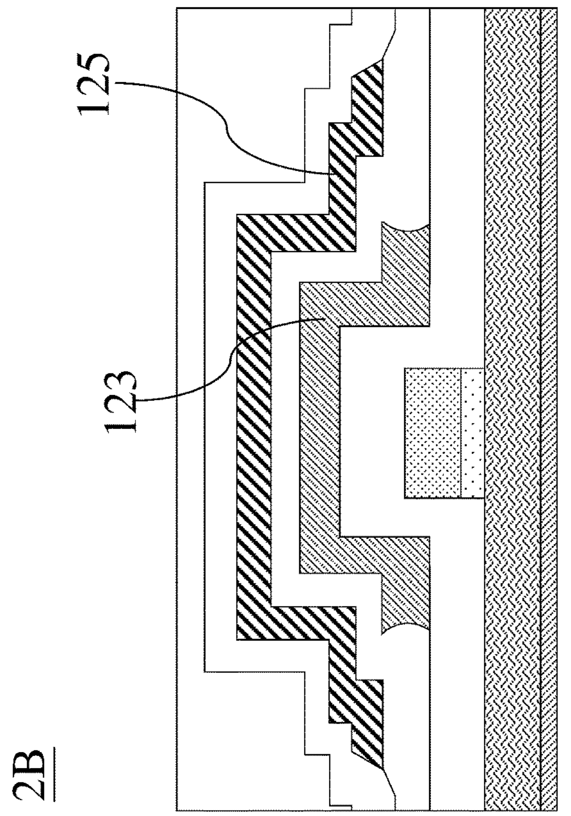
FIG. 4B is an enlarged view of a zone in FIG. 3C.
Figure 4A:
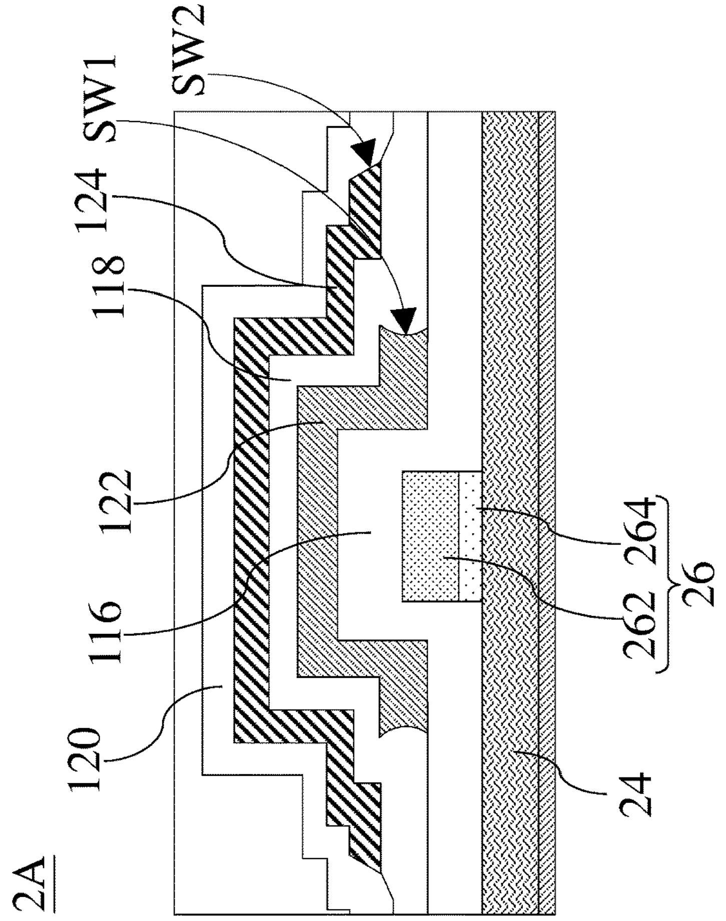
FIG. 4A is an enlarged view of a zone in FIG. 3C.

Referring to FIG. 4A, which is an enlarged view of a zone 2A in FIG. 3C, the illustration shows the detailed structural features resulted from the different processes for forming the field plates 122 and 123 and forming the field plates 124 and 125. The patterning of the field plates 122 and 123 can be achieved by using a wet etching process. The patterning of the field plates 124 and 125 can be achieved by using a dry etching process.

In this regard, a chemical process of the wet etching can provide a high etch selectivity. The high etch selectivity means that the etch rate is stronger with respect to the target material but weaker with respect to the non-target material. In contrast, dry etching has a drawback of low selectivity. One of the reasons for using dry etching for patterning the field plates 124 and 125 is that dry etching involves ion bombardment, such as reactive-ion etching (RIE), and features fast etching and is controllable with respect to the target material. Although dry etching has a low selectivity, the tradeoff between the low selectivity and above advantages can provide a positive effect for the second lowest field plate (i.e., the field plates 124 and 125).

As such, during the patterning of field plate 122, the passivation layer 116 can be free from etching and thus the morphological profile thereof would be retained. After patterning the field plates 122 and 123, the thickness of the passivation layer 116 can be kept the same or almost the same (i.e., the reduced quantity is negligible).

On the other hand, during patterning of the field plate 124, the passivation layer 118 is etched as it is exposed from the field plate 124, which is called over-etching, which would change the morphological profile thereof. As such, after the patterning the field plate 124, the thickness of the passivation layer 118 is significantly reduced. Although the over-etching occurs across the passivation layer 118, the positions of the field plates 122 and 124 have been constructed such that over-etching would not significantly affect the performance of the bidirectional switching device 1A. However, since the dry etching for pattering the field plate 124 has the favorable controllability, the efficiency of the process for manufacturing the bidirectional switching device 1A can be increased (e.g., speeding up the manufacturing process).

Furthermore, the difference between wet and dry etching creates a different profile of the field plates 122 and 124 at their edges/sidewalls. The field plate 122 has a sidewall SW1 extending upward from the passivation layer 116. The sidewall SW1 of the field plate 122 is recessed inward to receive the passivation layer 118. The field plate 124 has an oblique sidewall SW2 extending upward from the passivation layer 118. The reason for such difference relates to isotropic etching and anisotropic etching, which results from wet etching and dry etching, respectively. The sidewall SW1 of the field plate 122 has a profile different than that of the oblique sidewall SW2 of the field plate 124. Moreover, the field plates 122 and 124 may have different roughnesses. In some embodiments, a surface roughness of the oblique sidewall SW2 is greater than a surface roughness of the sidewall SW1. Herein, the surface roughness refers to a component of surface texture (i.e., the dimension would be much smaller than the layer thickness thereof).

As the sidewall SW2 of the field plate 124 is formed by the anisotropic process of the dry etching, the sidewall SW2 of the field plate 124 is flat and oblique. For example, the oblique sidewall SW2 of the field plate 124 extends upward from the passivation layer 118 and is oblique with respect to a top surface of the passivation layer 118. Furthermore, since over-etching occurs at the passivation layer 118, the side surface of the passivation layer 118 are lower than the oblique sidewall SW2 of the field plate 124. The side surface of the passivation layer 118 may have a flat and oblique profile. The side surface of the passivation layer 118 may extend obliquely from the oblique sidewall SW2 to a position lower than the top surface of the passivation layer 118. The degree of obliqueness in the oblique sidewall SW2 and the side surface of the passivation layer 118 may be different, which results from the etching selectivity therebetween (i.e., the field plate 124 and the passivation layer 118 having different etching rates with respect to the same etchant).

In some embodiments, the field plate 122 has approximately the same thickness as a thickness of the field plate 124. In some embodiments, the field plate 122 has a thickness greater than a thickness of the field plate 124. In some embodiments, the field plate 122 has a thickness less than a thickness of the field plate 124. The thickness relationship between the field plates 122 and 124 may depend on the practical requirements, such as the design on the distribution of the electric field or the process conditions. In some embodiments, the field plates 122 and 124 are made of the same conductive material. In some embodiments, the field plates 122 and 124 are made of different conductive materials.

Referring to FIG. 4B, which is an enlarged view of a zone 2B in FIG. 3C, the illustration shows the detailed structural features resulted from the different processes for forming the field plates 123 and 125. The patterning of the field plate 123 can be achieved by using a wet etching process; and the patterning of the field plate 125 can be achieved by using a dry etching process. The structural features of the field plates 122 and 124 can be applied to the field plates 123 and 125. That is, differences between the field plates 123 and 125 can refer to the above descriptions.

Referring to FIGS. 3B and 3C again, the spacer layer 130 is disposed above the spacer layer 120 and the source electrodes 30 and 32. The spacer layer 130 covers the spacer layer 120 and the source electrodes 30 and 32. The spacer layer 130 can serve as a planarization layer which has a level top surface to support other layers/elements. In some embodiments, the spacer layer 130 can be formed as being thicker, and a planarization process, such as chemical mechanical polish (CMP) process, is performed on the spacer layer 130 to remove the excess portions, thereby forming a level top surface. The exemplary materials of the spacer layer 130 can include, for example but are not limited to, SiNx, SiOx, $Si_3N_4$, SiON, SiC, SiBN, SiCBN, oxides, or combinations thereof. In some embodiments, the spacer layer 130 is a multi-layered structure, such as a composite dielectric layer of $Al_2O_3$/SiN, $Al_2O_3$/$SiO_2$, AlN/SiN, AlN/$SiO_2$, or combinations thereof.

The contact vias 134 are disposed within the spacer layer 130. The contact vias 132 penetrate the spacer layer 130. The contact vias 134 extend longitudinally to electrically couple with the source electrodes 30 and 32, respectively. The contact vias 136, 138, and 140 are disposed at least within the spacer layer 130. The contact vias 136, 138, and 140 penetrate at least one of the spacer layers 116, 118, 120, and 130. The contact vias 136 extend longitudinally to electrically couple with the field plates 124 and 125. The contact vias 138 extend longitudinally to electrically couple with the field plates 122 and 123. The contact vias 140 extend longitudinally to electrically couple with the gate electrodes 264 and 284. The exemplary materials of the vias 134, 136, 138, and 140 can include, for example but are not limited to, conductive materials, such as metals or alloys.

A patterned conductive layer 144 is disposed on the spacer layer 130 and the contact vias 134, 136, 138, and 140. The patterned conductive layer 144 is in contact with the contact vias 134, 136, 138, and 140. The patterned conductive layer 144 may have metal lines, pads, traces, or combinations thereof, such that the patterned conductive layer 144 can form at least one circuit. The exemplary materials of the patterned conductive layer 144 can include, for example but are not limited to, conductive materials. The patterned conductive layer 144 may include a single film or multilayered film having Ag, Al, Cu, Mo, Ni, Ti, alloys thereof, oxides thereof, nitrides thereof, or combinations thereof.

The spacer layer 132 is disposed above the spacer layer 130 and the patterned conductive layer 144. The spacer layer 132 covers the spacer layer 130 and the patterned conductive layer 144. The spacer layer 132 can serve as a planarization layer which has a level top surface to support other layers/elements. In some embodiments, the spacer layer 132 can be formed as being thicker, and a planarization process, such as CMP process, is performed on the spacer layer 132 to remove the excess portions, thereby forming a level top surface. The exemplary materials of the spacer layer 132 can include, for example but are not limited to, SiNx, SiOx, $Si_3N_4$, SiON, SiC, SiBN, SiCBN, oxides, or combinations thereof. In some embodiments, the spacer layer 132 is a multi-layered structure, such as a composite dielectric layer of $Al_2O_3$/SiN, $Al_2O_3$/$SiO_2$, AlN/SiN, AlN/$SiO_2$, or combinations thereof.

The contact vias 142 are disposed within the spacer layer 132. The contact vias 142 penetrate the spacer layer 132. The contact vias 142 extend longitudinally to electrically couple with the patterned conductive layer 144. The upper surfaces of the contact vias 142 are free from coverage of the spacer layer 132. The exemplary materials of the contact vias 142 can include, for example, but are not limited to, conductive materials, such as metals or alloys.

A patterned conductive layer 146 is disposed on the spacer layer 132 and the contact vias 142. The patterned conductive layer 146 is in contact with the contact vias 142. The patterned conductive layer 146 may have metal lines, pads, traces, or combinations thereof, such that the patterned conductive layer 146 can form at least one circuit. The exemplary materials of the patterned conductive layer 146 can include, for example but are not limited to, conductive materials. The patterned conductive layer 146 may include a single film or multilayered film having Ag, Al, Cu, Mo, Ni, Ti, alloys thereof, oxides thereof, nitrides thereof, or combinations thereof.

The circuit of the patterned conductive layer 144 or 146 can connect different layers/elements in the structure, making these layers or elements have the same electrical potential. For example, the vias 136, 138, 140 are disposed on and electrically coupled to the gate electrodes 264 and 284, and the field plates 122, 123, 124, 125. By such connection, the gate electrodes 264 and 284, and the field plates 122, 123, 124, 125 can be electrically connected to each other via the circuit of the patterned conductive layer 144 to have the same electrical potential, and thus the field plates 122, 123, 124, 125 can act as gate field plates.

The protection layer 148 is disposed above the spacer layer 132 and the patterned conductive layer 146. The protection layer 148 covers the spacer layer 132 and the patterned conductive layer 146. The protection layer 148 can prevent the patterned conductive layer 146 from oxidizing. Some portions of the patterned conductive layer 146 can be exposed through openings in the protection layer 148, which are configured to electrically connect to external elements (e.g., an external circuit).

The relationship among the gate electrodes 264 and 284 and the field plates 122, 123, 124, 125 is variable. The variation can depend on the requirements of the device design. For example, for a high voltage device, parasitic capacitance may be generated between two conductive layers. Accordingly, profiled of conductive layers might need to get modified to match the structure requirements. For example, for a purpose of suppressing electrical field distribution, at least one field plate can be formed to have a large area.

Figure 5:
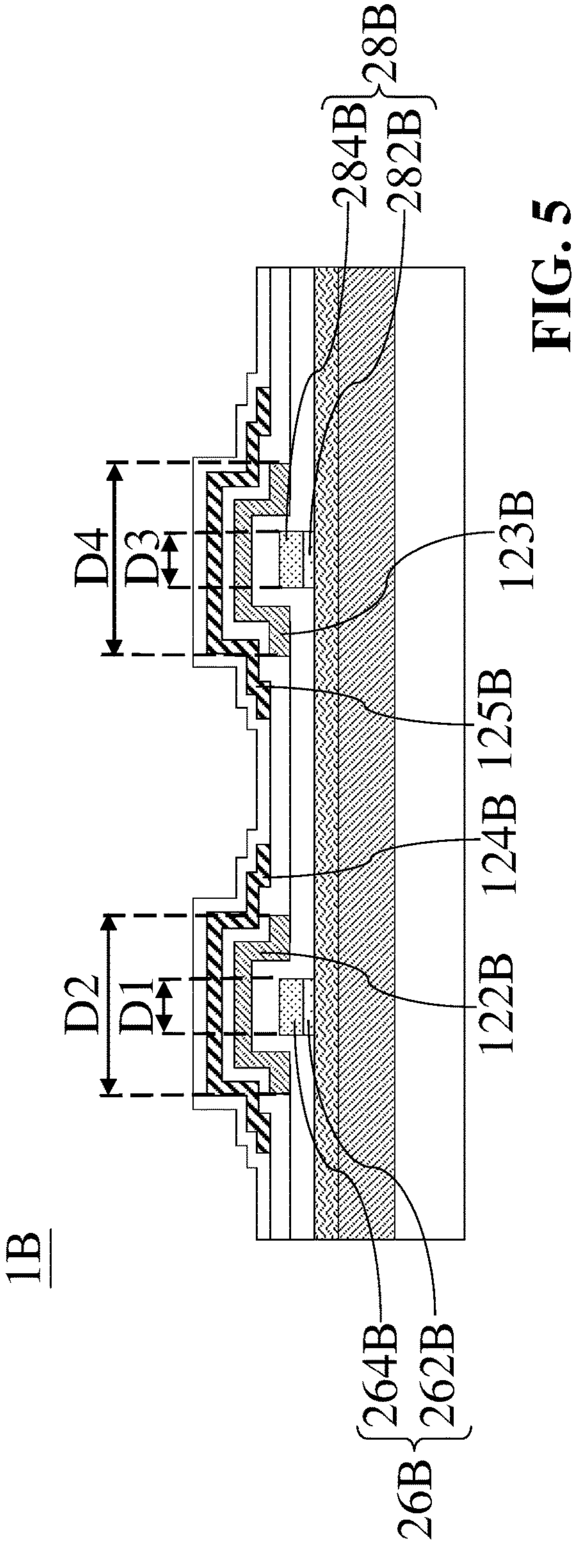
FIG. 5 is a cross-sectional view of a bidirectional switching device according to some embodiments of the present disclosure.

FIG. 5 is a cross-sectional view of a bidirectional switching device 1B according to some embodiments of the present disclosure. The bidirectional switching device 1B includes gate structures 26B and 28B, field plates 122B, 123B, 124B, and 125B. The gate structures 26B includes a p-type doped III-V compound semiconductor layer 262B and a gate electrode 264B. The gate structures 28B includes a p-type doped III-V compound semiconductor layer 282B and a gate electrode 284B.

The field plate 122B is laterally overlapped with the gate structure 26B. In the exemplary illustration of the present embodiment, the field plate 122B is laterally overlapped with the gate structure 26B for a distance D1 equal to entire length of the gate structure 26B. The field plate 124B is laterally overlapped with the gate structure 26B. In the exemplary illustration of the present embodiment, the field plate 124B is laterally overlapped with the gate structure 26B for a distance D1 equal to entire length of the gate structure 26B. The field plate 124B is laterally overlapped with the field plate 122B. In the exemplary illustration of the present embodiment, the field plate 124B is laterally overlapped with the field plate 122B for a distance D2 equal to entire length of the field plate 122B.

The field plate 123B is laterally overlapped with the gate structure 28B. In the exemplary illustration of the present embodiment, the field plate 123B is laterally overlapped with the gate structure 28B for a distance D3 equal to entire length of the gate structure 28B. The field plate 125B is laterally overlapped with the gate structure 28B. In the exemplary illustration of the present embodiment, the field plate 125B is laterally overlapped with the gate structure 28B for a distance D3 equal to entire length of the gate structure 28B. The field plate 125B is laterally overlapped with the field plate 123B. In the exemplary illustration of the present embodiment, the field plate 125B is laterally overlapped with the field plate 123B for a distance D4 equal to entire length of the field plate 123B.

Figure 6:
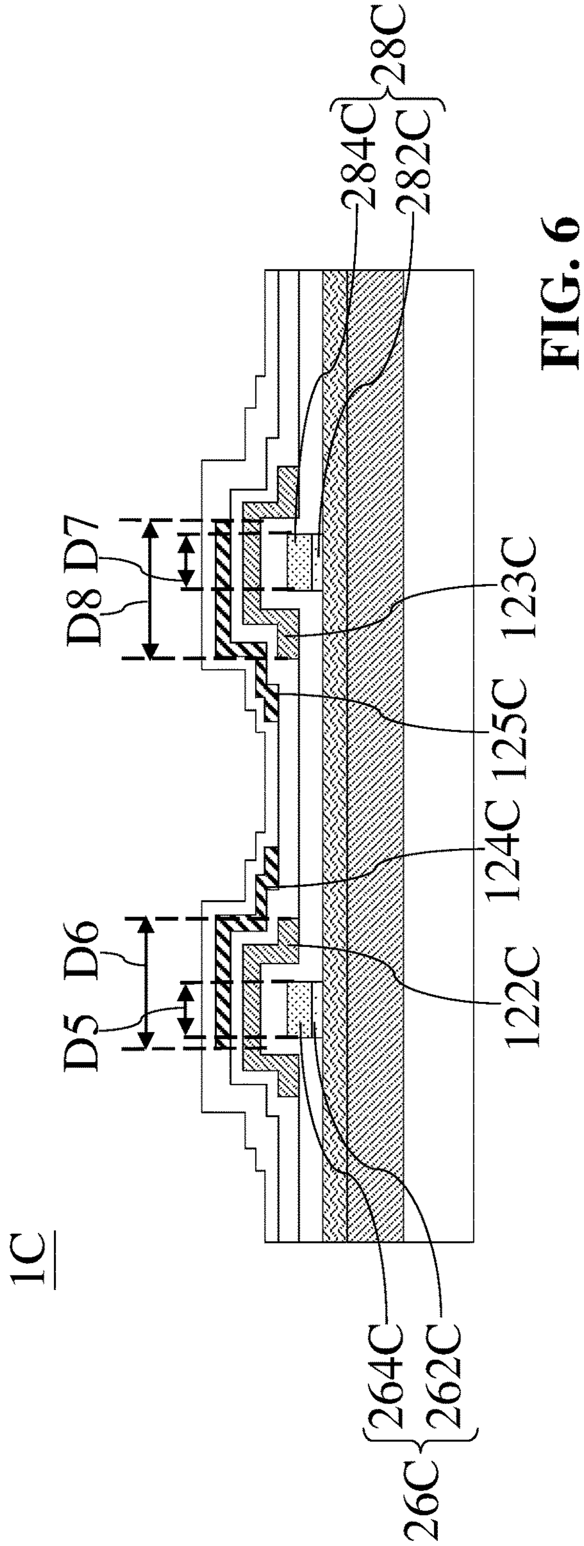
FIG. 6 is a cross-sectional view of a bidirectional switching device according to some embodiments of the present disclosure.

FIG. 6 is a cross-sectional view of a bidirectional switching device 1C according to some embodiments of the present disclosure. The bidirectional switching device 1C is similar to the bidirectional switching device 1B as described and illustrated with reference to FIG. 5, except that the field plates 124B and 125B are replaced by field plates 124C and 125C.

The bidirectional switching device 1C includes gate structures 26C and 28C, field plates 122C, 123C, 124C, and 125C. The gate structures 26C includes a p-type doped III-V compound semiconductor layer 262C and a gate electrode 264C. The gate structures 28C includes a p-type doped III-V compound semiconductor layer 282C and a gate electrode 284C.

The field plate 122C is laterally overlapped with the gate structure 26C. In the exemplary illustration of the present embodiment, the field plate 122C is laterally overlapped with the gate structure 26C for a distance D5 equal to entire length of the gate structure 26C. The field plate 124C is laterally overlapped with the gate structure 26C. In the exemplary illustration of the present embodiment, the field plate 124C is laterally overlapped with the gate structure 26C for a distance D5 equal to entire length of the gate structure 26C. The field plate 124C is laterally overlapped with the field plate 122C. In the exemplary illustration of the present embodiment, the field plate 124C is laterally overlapped with the field plate 122C for a distance D6 less than entire length of the field plate 122B.

The field plate 123C is laterally overlapped with the gate structure 28C. In the exemplary illustration of the present embodiment, the field plate 123C is laterally overlapped with the gate structure 28C for a distance D7 equal to entire length of the gate structure 28C. The field plate 125C is laterally overlapped with the gate structure 28C. In the exemplary illustration of the present embodiment, the field plate 125C is laterally overlapped with the gate structure 28C for a distance D7 equal to entire length of the gate structure 28C. The field plate 125C is laterally overlapped with the field plate 123C. In the exemplary illustration of the present embodiment, the field plate 125C is laterally overlapped with the field plate 123C for a distance D8 less than entire length of the field plate 123C.

Figure 7:
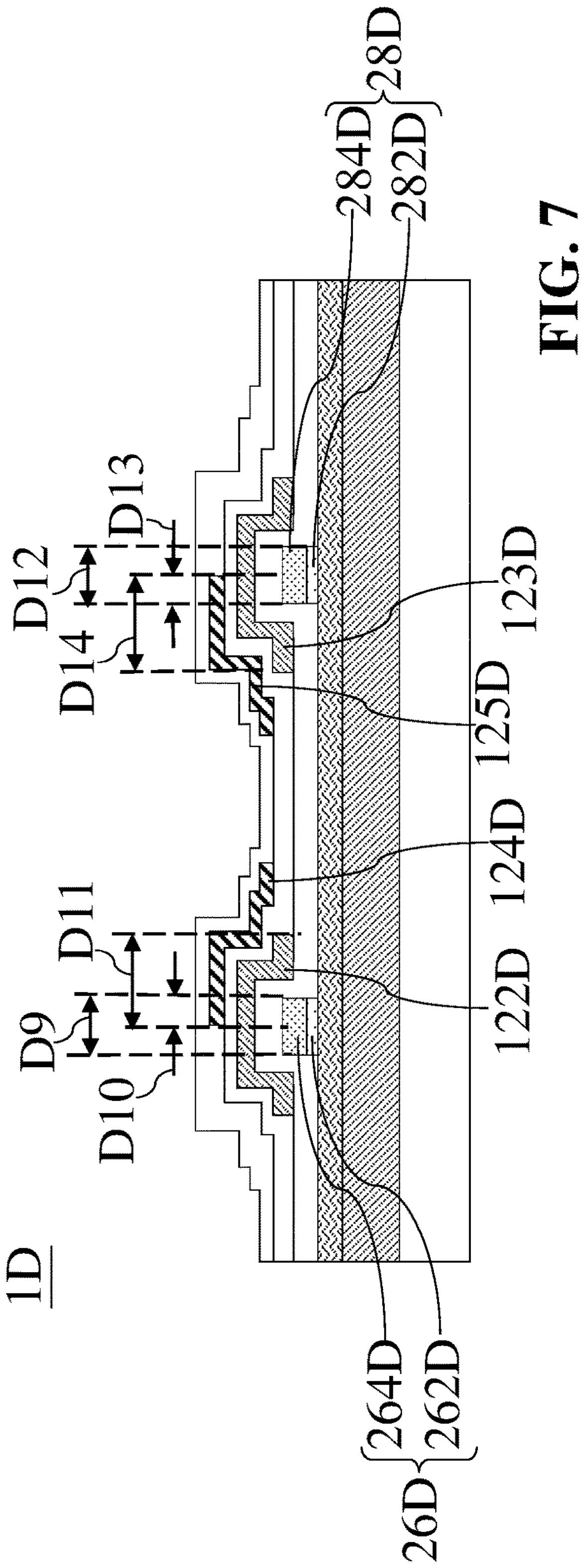
FIG. 7 is a cross-sectional view of a bidirectional switching device according to some embodiments of the present disclosure.

FIG. 7 is a cross-sectional view of a bidirectional switching device 1D according to some embodiments of the present disclosure. The bidirectional switching device 1D is similar to the bidirectional switching device 1B as described and illustrated with reference to FIG. 5, except that the field plates 124B and 125B are replaced by field plates 124D and 125D.

The bidirectional switching device 1D includes gate structures 26D and 28D, field plates 122D, 123D, 124D, and 12D. The gate structures 26D includes a p-type doped III-V compound semiconductor layer 262D and a gate electrode 264D. The gate structures 28D includes a p-type doped III-V compound semiconductor layer 282D and a gate electrode 284D.

The field plate 122D is laterally overlapped with the gate structure 26D. In the exemplary illustration of the present embodiment, the field plate 122D is laterally overlapped with the gate structure 26D for a distance D9 equal to entire length of the gate structure 26D. The field plate 124D is laterally overlapped with the gate structure 26D. In the exemplary illustration of the present embodiment, the field plate 124D is laterally overlapped with the gate structure 26D for a distance D10 less than entire length of the gate structure 26D. The field plate 124D is laterally overlapped with the field plate 122D. In the exemplary illustration of the present embodiment, the field plate 124D is laterally overlapped with the field plate 122D for a distance D11 less than entire length of the field plate 122D.

The field plate 123D is laterally overlapped with the gate structure 28D. In the exemplary illustration of the present embodiment, the field plate 123D is laterally overlapped with the gate structure 28D for a distance D12 equal to entire length of the gate structure 28D. The field plate 125D is laterally overlapped with the gate structure 28D. In the exemplary illustration of the present embodiment, the field plate 125D is laterally overlapped with the gate structure 28D for a distance D13 less than entire length of the gate structure 28D. The field plate 125D is laterally overlapped with the field plate 123D. In the exemplary illustration of the present embodiment, the field plate 125D is laterally overlapped with the field plate 123D for a distance D14 less than entire length of the field plate 123D.

Figure 8:
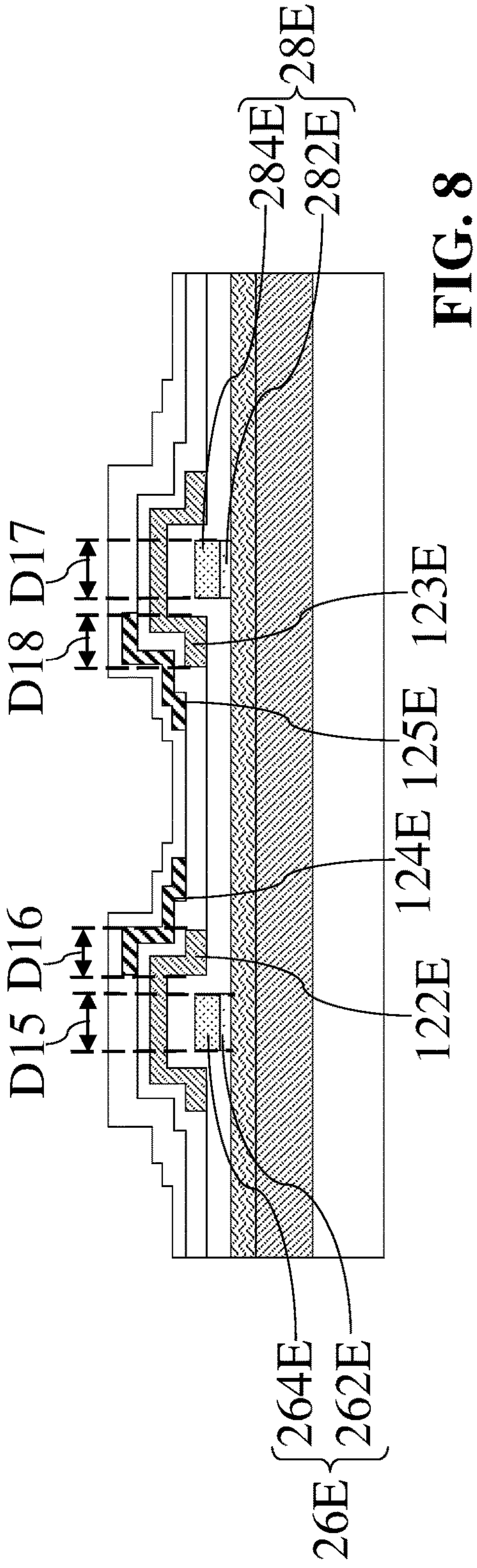
FIG. 8 is a cross-sectional view of a bidirectional switching device according to some embodiments of the present disclosure.

FIG. 8 is a cross-sectional view of a bidirectional switching device 1E according to some embodiments of the present disclosure. The bidirectional switching device 1E is similar to the bidirectional switching device 1B as described and illustrated with reference to FIG. 5, except that the field plates 124B and 125B are replaced by field plates 124E and 125E.

The bidirectional switching device 1E includes gate structures 26E and 28E, field plates 122E, 123E, 124E, and 12E. The gate structures 26E includes a p-type doped III-V compound semiconductor layer 262E and a gate electrode 264E. The gate structures 28E includes a p-type doped III-V compound semiconductor layer 282E and a gate electrode 284E.

The field plate 122E is laterally overlapped with the gate structure 26E. In the exemplary illustration of the present embodiment, the field plate 122E is laterally overlapped with the gate structure 26E for a distance D15 equal to entire length of the gate structure 26E. The field plate 124E is not laterally overlapped with the gate structure 26E. The field plate 124E is laterally overlapped with the field plate 122E. In the exemplary illustration of the present embodiment, the field plate 124E is laterally overlapped with the field plate 122E for a distance D16 less than entire length of the field plate 122E.

The field plate 123E is laterally overlapped with the gate structure 28E. In the exemplary illustration of the present embodiment, the field plate 123E is laterally overlapped with the gate structure 28E for a distance D17 equal to entire length of the gate structure 28E. The field plate 125E is not laterally overlapped with the gate structure 28E. The field plate 125E is laterally overlapped with the field plate 123E. In the exemplary illustration of the present embodiment, the field plate 125E is laterally overlapped with the field plate 123E for a distance D18 less than entire length of the field plate 123E.

Figure 9:
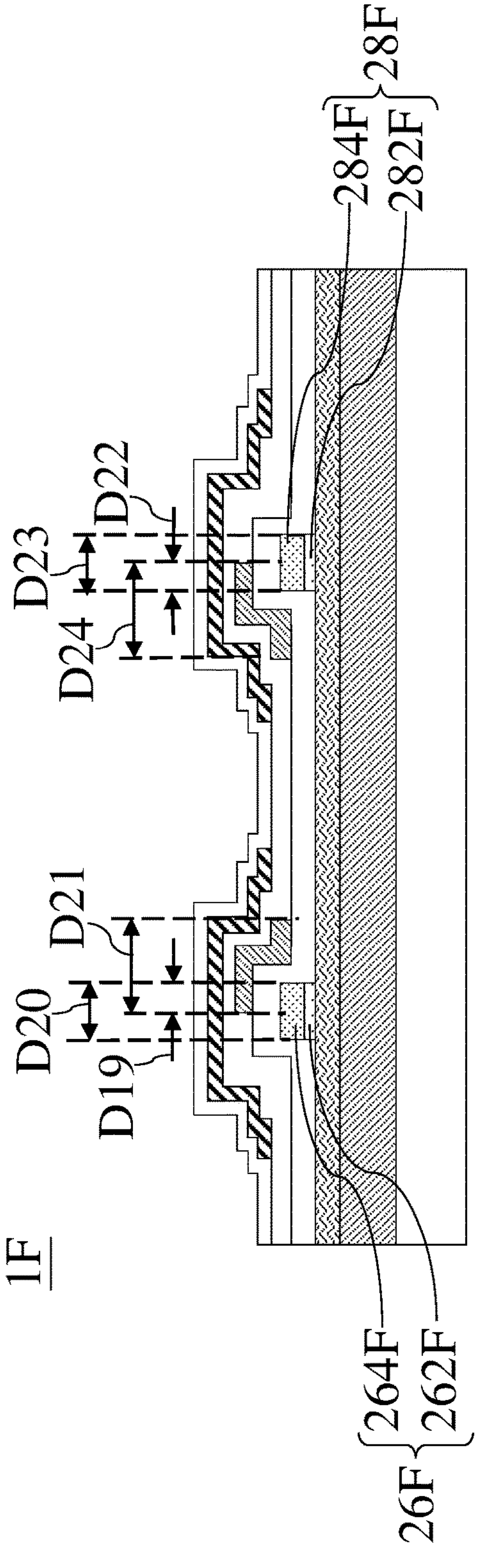
FIG. 9 is a cross-sectional view of a bidirectional switching device according to some embodiments of the present disclosure.

FIG. 9 is a cross-sectional view of a bidirectional switching device 1F according to some embodiments of the present disclosure. The bidirectional switching device 1F is similar to the bidirectional switching device 1B as described and illustrated with reference to FIG. 5, except that the field plates 122B, 123B, 124B, and 125B are replaced by field plates 122F, 123F, 124F, and 125F.

The bidirectional switching device 1F includes gate structures 26F and 28F, field plates 122F, 123F, 124F, and 125F. The gate structures 26F includes a p-type doped III-V compound semiconductor layer 262F and a gate electrode 264F. The gate structures 28F includes a p-type doped III-V compound semiconductor layer 282F and a gate electrode 284F.

The field plate 122F is laterally overlapped with the gate structure 26F. In the exemplary illustration of the present embodiment, the field plate 122F is laterally overlapped with the gate structure 26F for a distance D19 less than entire length of the gate structure 26F. The field plate 124F is laterally overlapped with the gate structure 26F. In the exemplary illustration of the present embodiment, the field plate 124F is laterally overlapped with the gate structure 26F for a distance D20 equal to entire length of the gate structure 26F. The field plate 124F is laterally overlapped with the field plate 122F. In the exemplary illustration of the present embodiment, the field plate 124F is laterally overlapped with the field plate 122F for a distance D21 equal to entire length of the field plate 122F.

The field plate 123F is laterally overlapped with the gate structure 28F. In the exemplary illustration of the present embodiment, the field plate 123F is laterally overlapped with the gate structure 28F for a distance D22 less than entire length of the gate structure 28F. The field plate 125F is laterally overlapped with the gate structure 28F. In the exemplary illustration of the present embodiment, the field plate 125F is laterally overlapped with the gate structure 28F for a distance D23 equal to entire length of the gate structure 28F. The field plate 125F is laterally overlapped with the field plate 123F. In the exemplary illustration of the present embodiment, the field plate 125F is laterally overlapped with the field plate 123F for a distance D24 equal to entire length of the field plate 123F.

Figure 10:
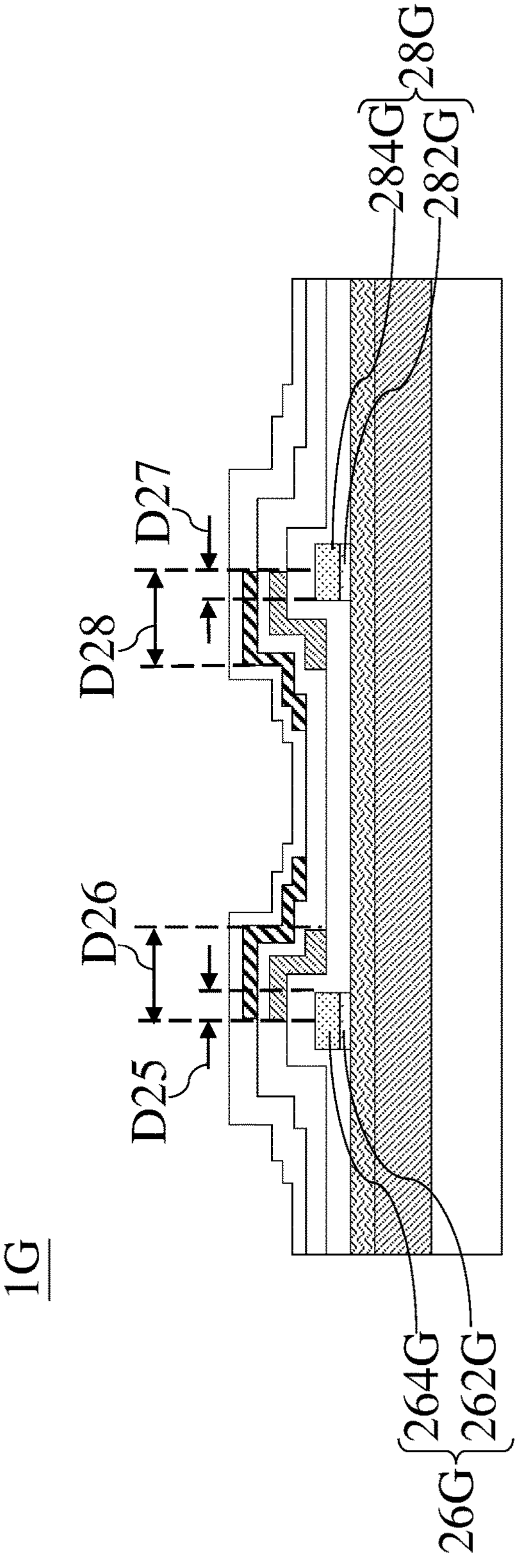
FIG. 10 is a cross-sectional view of a bidirectional switching device according to some embodiments of the present disclosure.

FIG. 10 is a cross-sectional view of a bidirectional switching device 1G according to some embodiments of the present disclosure. The bidirectional switching device 1G is similar to the bidirectional switching device 1F as described and illustrated with reference to FIG. 9, except that the field plates 124F and 125F are replaced by field plates 124G and 125G.

The bidirectional switching device 1G includes gate structures 26G and 28G, field plates 122G, 123G, 124G, and 125G. The gate structures 26G includes a p-type doped III-V compound semiconductor layer 262G and a gate electrode 264G. The gate structures 28G includes a p-type doped III-V compound semiconductor layer 282G and a gate electrode 284G.

The field plate 122G is laterally overlapped with the gate structure 26G. In the exemplary illustration of the present embodiment, the field plate 122G is laterally overlapped with the gate structure 26G for a distance D25 less than entire length of the gate structure 26G. The field plate 124G is laterally overlapped with the gate structure 26G. In the exemplary illustration of the present embodiment, the field plate 124G is laterally overlapped with the gate structure 26G for a distance D25 less than entire length of the gate structure 26G. The field plate 124G is laterally overlapped with the field plate 122G. In the exemplary illustration of the present embodiment, the field plate 124G is laterally overlapped with the field plate 122G for a distance D26 equal to entire length of the field plate 122G.

The field plate 123G is laterally overlapped with the gate structure 28G. In the exemplary illustration of the present embodiment, the field plate 123G is laterally overlapped with the gate structure 28G for a distance D27 less than entire length of the gate structure 28G. The field plate 125G is laterally overlapped with the gate structure 28G. In the exemplary illustration of the present embodiment, the field plate 125G is laterally overlapped with the gate structure 28G for a distance D27 less than entire length of the gate structure 28G. The field plate 125G is laterally overlapped with the field plate 123G. In the exemplary illustration of the present embodiment, the field plate 125G is laterally overlapped with the field plate 123G for a distance D28 equal to entire length of the field plate 123G.

Figure 11:
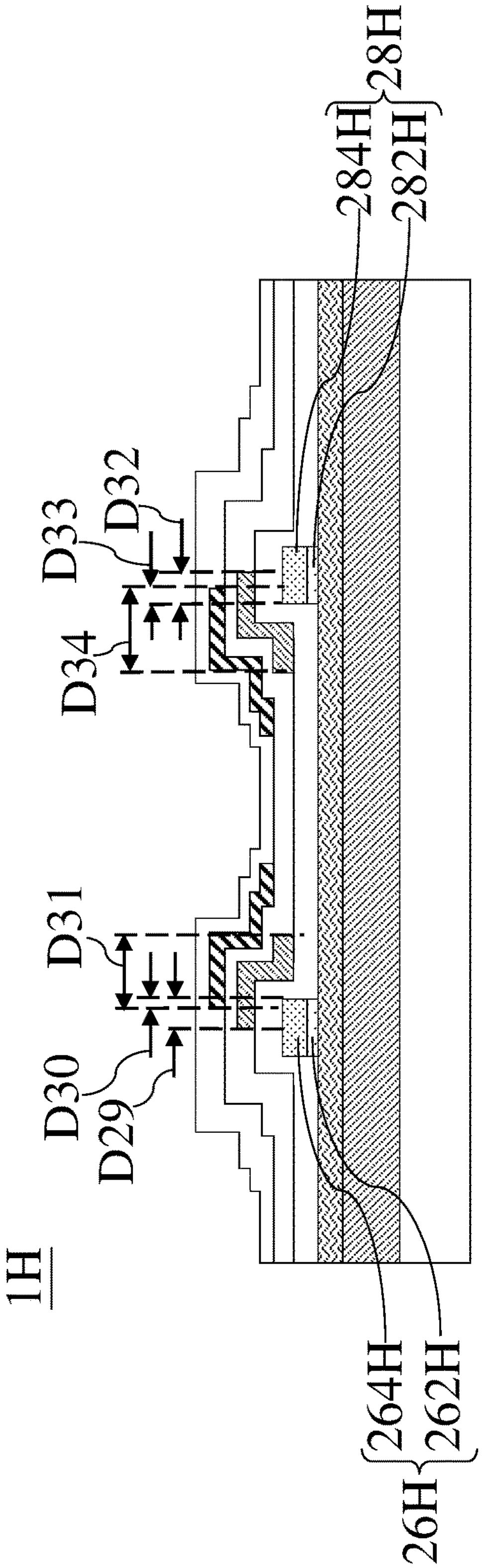
FIG. 11 is a cross-sectional view of a bidirectional switching device according to some embodiments of the present disclosure.

FIG. 11 is a cross-sectional view of a bidirectional switching device 1H according to some embodiments of the present disclosure. The bidirectional switching device 1H is similar to the bidirectional switching device 1F as described and illustrated with reference to FIG. 9, except that the field plates 124F and 125F are replaced by field plates 124H and 125H.

The bidirectional switching device 1H includes gate structures 26H and 28H, field plates 122H, 123H, 124H, and 125H. The gate structures 26H includes a p-type doped III-V compound semiconductor layer 262H and a gate electrode 264H. The gate structures 28H includes a p-type doped III-V compound semiconductor layer 282H and a gate electrode 284H.

The field plate 122H is laterally overlapped with the gate structure 26H. In the exemplary illustration of the present embodiment, the field plate 122H is laterally overlapped with the gate structure 26H for a distance D29 less than entire length of the gate structure 26H. The field plate 124H is laterally overlapped with the gate structure 26H. In the exemplary illustration of the present embodiment, the field plate 124H is laterally overlapped with the gate structure 26H for a distance D30 less than entire length of the gate structure 26H. The field plate 124H is laterally overlapped with the field plate 122H. In the exemplary illustration of the present embodiment, the field plate 124H is laterally overlapped with the field plate 122H for a distance D31 less than entire length of the field plate 122H.

The field plate 123H is laterally overlapped with the gate structure 28H. In the exemplary illustration of the present embodiment, the field plate 123H is laterally overlapped with the gate structure 28H for a distance D32 less than entire length of the gate structure 28H. The field plate 125H is laterally overlapped with the gate structure 28H. In the exemplary illustration of the present embodiment, the field plate 125H is laterally overlapped with the gate structure 28H for a distance D33 less than entire length of the gate structure 28H. The field plate 125H is laterally overlapped with the field plate 123H. In the exemplary illustration of the present embodiment, the field plate 125H is laterally overlapped with the field plate 123H for a distance D34 less than entire length of the field plate 123H.

Figure 12:
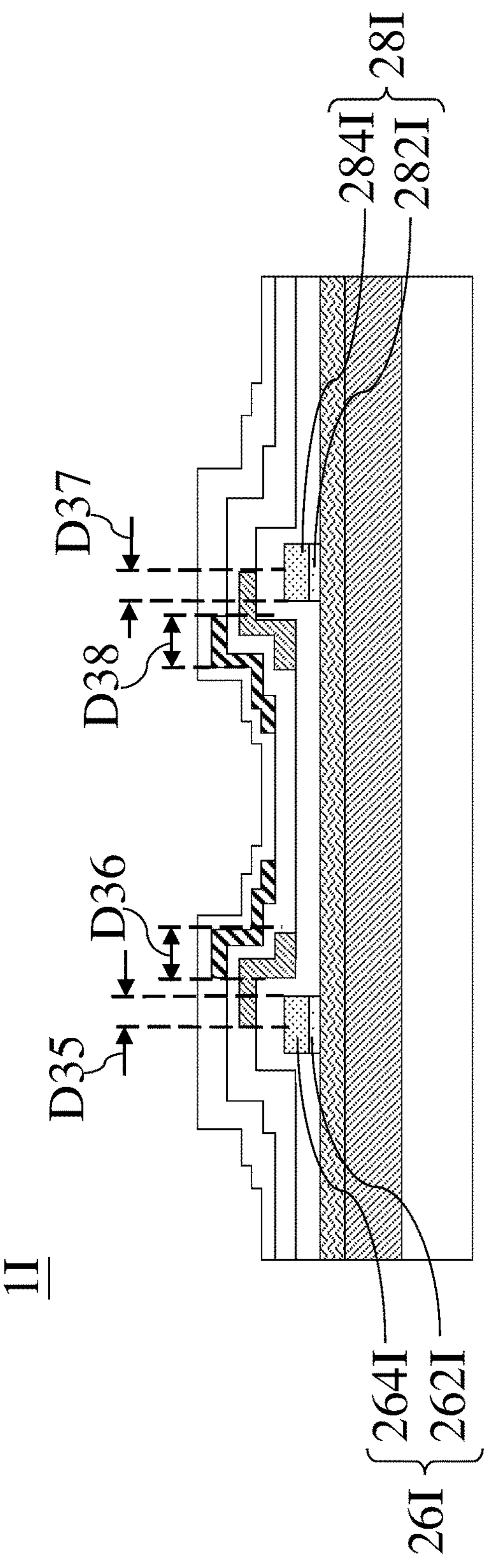
FIG. 12 is a cross-sectional view of a bidirectional switching device according to some embodiments of the present disclosure.

FIG. 12 is a cross-sectional view of a bidirectional switching device 1I according to some embodiments of the present disclosure. The bidirectional switching device 1I is similar to the bidirectional switching device 1F as described and illustrated with reference to FIG. 9, except that the field plates 124F and 125F are replaced by field plates 124I and 125I.

The bidirectional switching device 1I includes gate structures 26I and 28I, field plates 122I, 123I, 124I, and 125I. The gate structures 26I includes a p-type doped III-V compound semiconductor layer 262I and a gate electrode 264I. The gate structures 28I includes a p-type doped III-V compound semiconductor layer 282I and a gate electrode 284I.

The field plate 122I is laterally overlapped with the gate structure 26I. In the exemplary illustration of the present embodiment, the field plate 122I is laterally overlapped with the gate structure 26I for a distance D35 less than entire length of the gate structure 26I. The field plate 124I is not laterally overlapped with the gate structure 26I. The field plate 124I is laterally overlapped with the field plate 122I. In the exemplary illustration of the present embodiment, the field plate 124I is laterally overlapped with the field plate 122I for a distance D36 less than entire length of the field plate 122I.

The field plate 123I is laterally overlapped with the gate structure 28I. In the exemplary illustration of the present embodiment, the field plate 123I is laterally overlapped with the gate structure 28I for a distance D37 equal to entire length of the gate structure 28I. The field plate 125I is not laterally overlapped with the gate structure 28I. The field plate 125I is laterally overlapped with the field plate 123I. In the exemplary illustration of the present embodiment, the field plate 125I is laterally overlapped with the field plate 123I for a distance D38 less than entire length of the field plate 123I.

Figure 13:
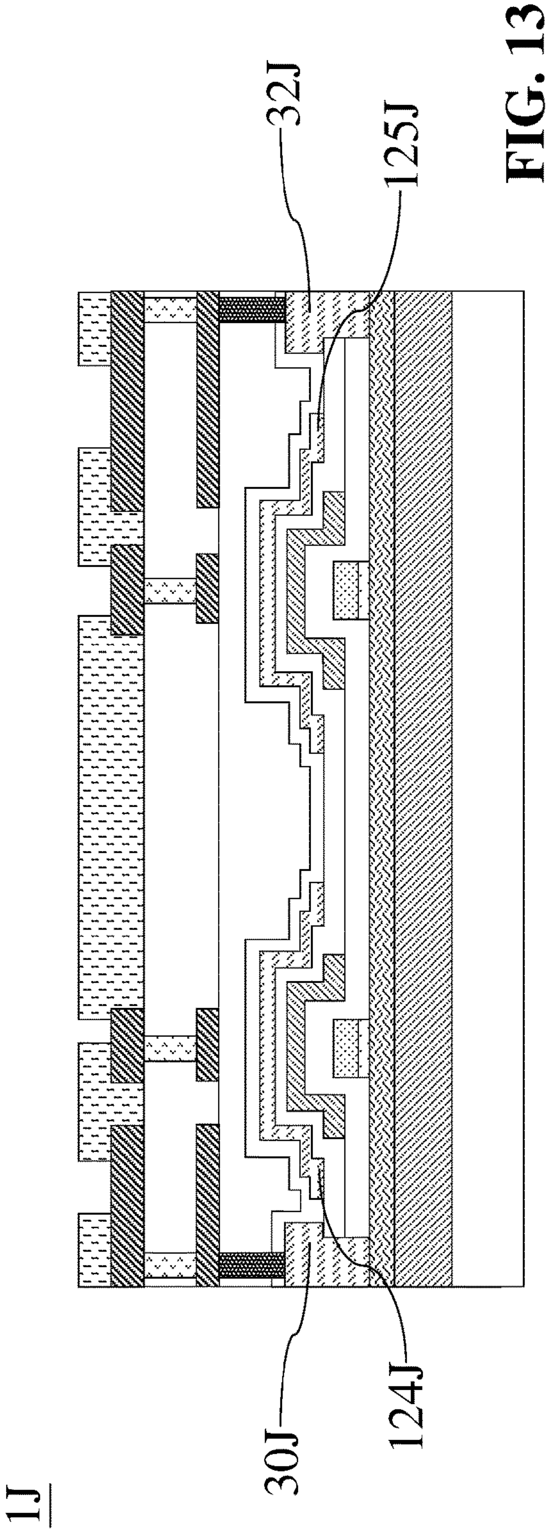
FIG. 13 is a cross-sectional view of a bidirectional switching device according to some embodiments of the present disclosure.

FIG. 13 is a cross-sectional view of a bidirectional switching device 1J according to some embodiments of the present disclosure. The bidirectional switching device 1J is similar to the bidirectional switching device 1A as described and illustrated with reference to FIGS. 3A-3C, except that the field plates 124B and 125B are replaced by field plates 124J and 125J. In the present embodiment, the field plates 124J and 125J and the source electrode 30J and 32J are made of the same conductive material. In the manufacturing stage, the field plates 124J and 125J and the source electrode 30J and 32J can be formed form the same blanket conductive layer.

Figure 14:
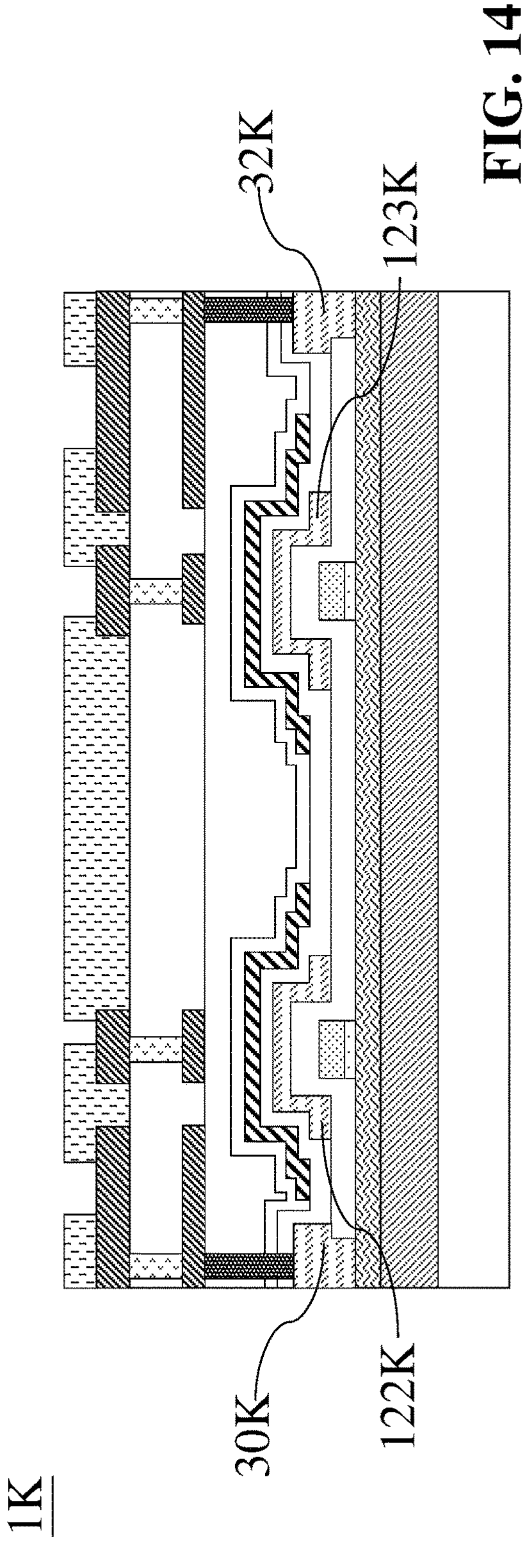
FIG. 14 is a cross-sectional view of a bidirectional switching device according to some embodiments of the present disclosure.

FIG. 14 is a cross-sectional view of a bidirectional switching device 1K according to some embodiments of the present disclosure. The bidirectional switching device 1K is similar to the bidirectional switching device 1A as described and illustrated with reference to FIGS. 3A-3C, except that the field plates 122 and 123 are replaced by field plates 122K and 123K. In the present embodiment, the field plates 122K and 123K and the source electrode 30K and 32K are made of the same conductive material. In the manufacturing stage, the field plates 122K and 123K and the source electrode 30K and 32K can be formed form the same blanket conductive layer.

As described above, based on the field plate design for the dual gate transistor, various structures applying such the design can be achieved. The design can be compatible with different requirements. That is, the field plate design for the dual gate transistor of the present disclosure is flexible and thus has high compatibility in the HEMT device field.

Different stages of a method for manufacturing a bidirectional switching device are shown in FIGS. 15A-15L, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 15A:
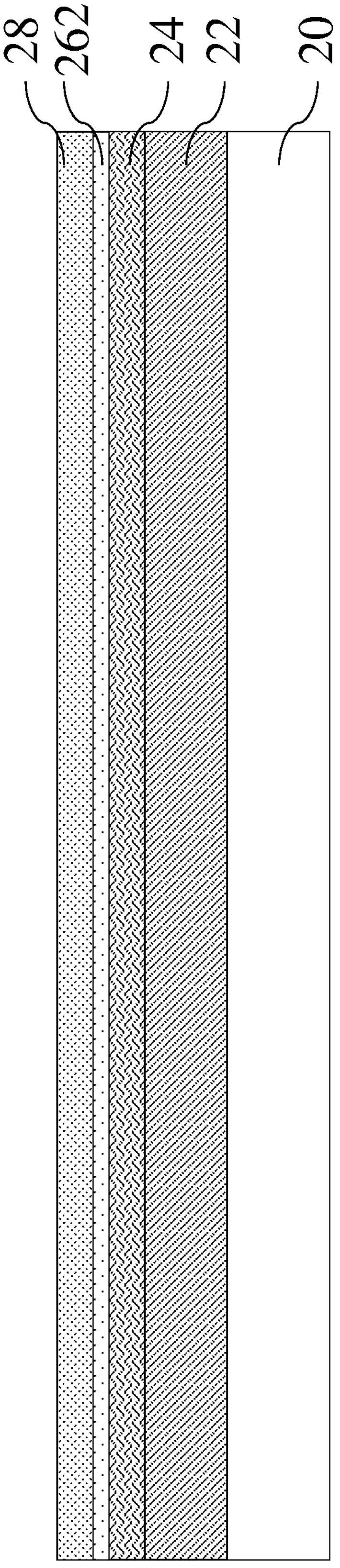
FIGS. 15A, 15B, 15C, 15D, 15E, 15F, 15G, 15H, 15I, 15J, 15K, 15L illustrate different stages of a method for manufacturing a semiconductor device according to some embodiments of the present disclosure.
Figure 15B:
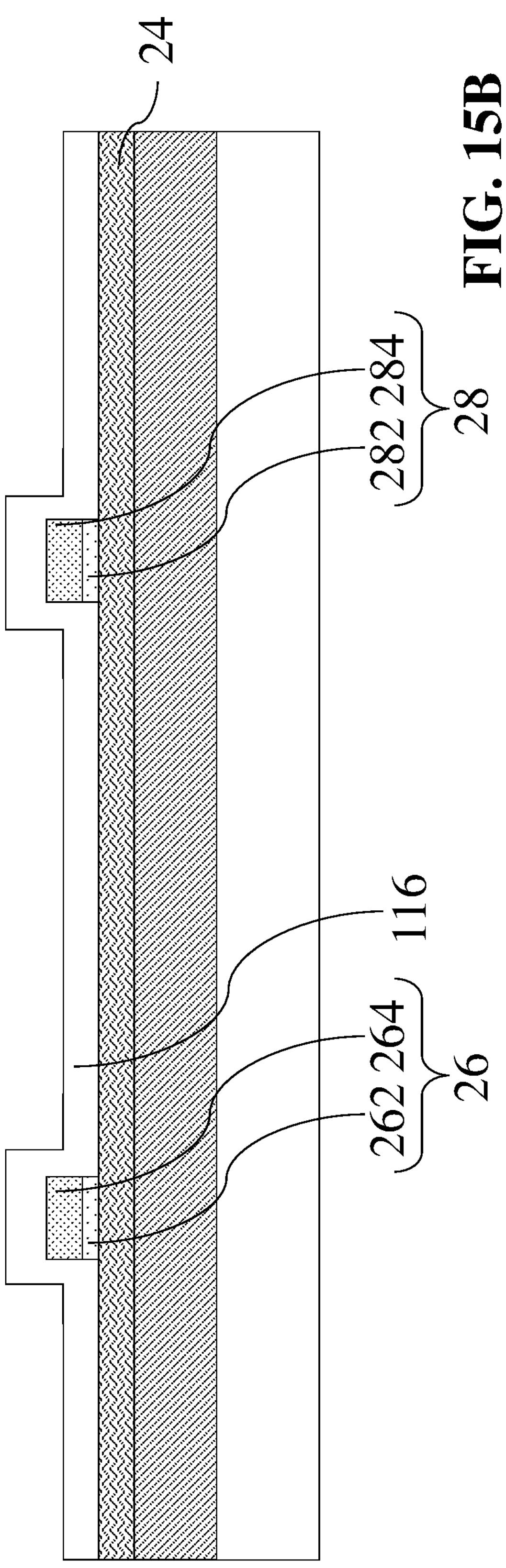

Referring to FIG. 15A, a substrate 20 is provided. Nitride-based semiconductor layers 22 and 24 can be formed over the substrate 20 in sequence by using the above-mentioned deposition techniques. A blanket p-type doped III-V compound semiconductor layer 262 and a blanket conductive layer 28 can be formed above the nitride-based semiconductor layer 24 in sequence by using the above-mentioned deposition techniques.

Referring to FIG. 3B, the blanket p-type doped III-V compound semiconductor layer 262 and the blanket conductive layer 28 are patterned to form a plurality of gate structures 26 and 28 over the nitride-based semiconductor layer 24. Each of the gate structures 26 and 28 includes a p-type doped III-V compound semiconductor layer 262/282 and a gate electrode 264/284. The patterning process can be performed by photolithography, exposure and development, etching, other suitable processes, or combinations thereof. A passivation layer 116 can be formed to cover the of the gate structure 26 by using the above-mentioned deposition techniques. By covering the gate structures 26 and 28, the passivation layer 116 can form a plurality of protruding portions above the nitride-based semiconductor layer 24 with the gate electrodes 264 and 282.

Figure 15C:
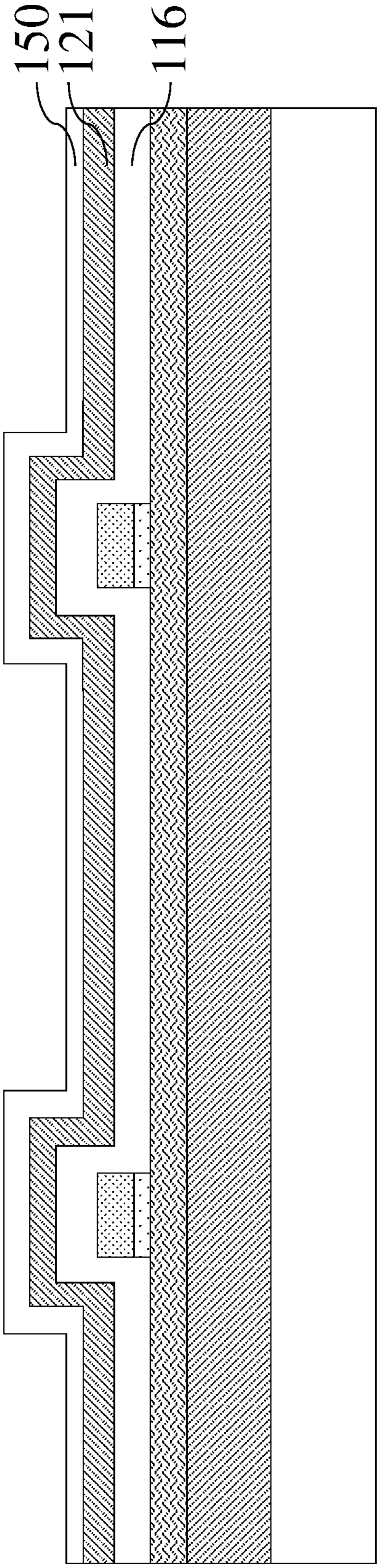

Referring to FIG. 15C, a blanket conductive layer 121 and a mask layer 150 can be formed above the passivation layer 116 in sequence by using the above-mentioned deposition techniques. The mask layer 150 can serve as a wet-etching mask for the blanket conductive layer 121 during patterning the same. In some embodiments, the blanket conductive layer 121 is made of TiN and the mask layer 150 is made of SiOx (e.g., SiO2).

Figure 15D:
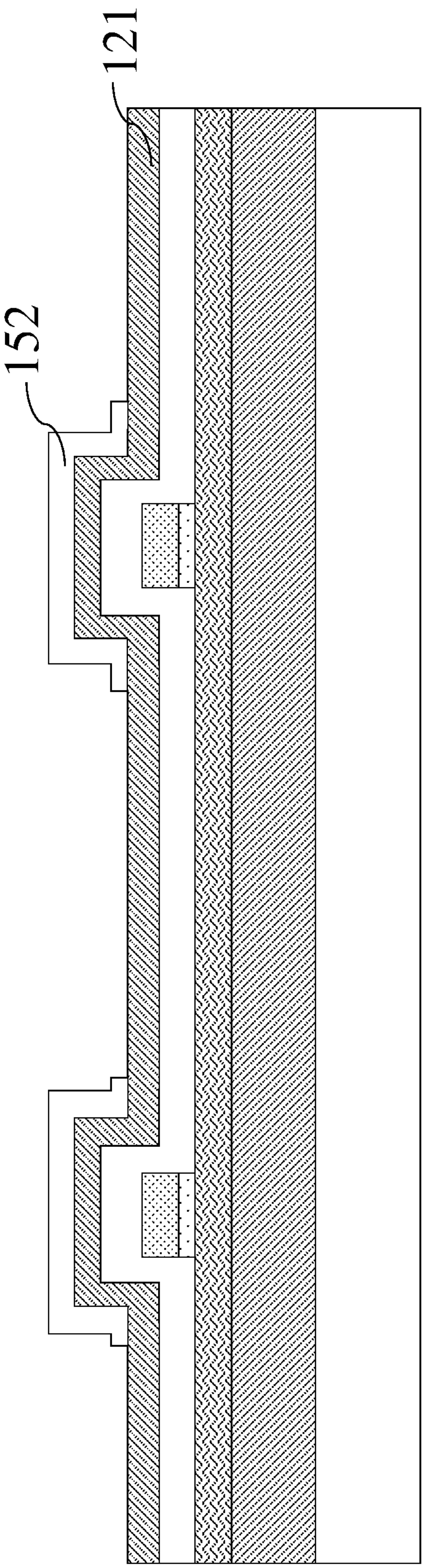

Referring to FIG. 15D, the mask layer 150 is patterned to form a mask layer 152 having openings. Some portions of the blanket conductive layer 121 are exposed from the openings of the mask layer 152. The profile of the mask layer 152 can be transferred to the blanket conductive layer 121 by performing a patterning process.

Figure 15E:
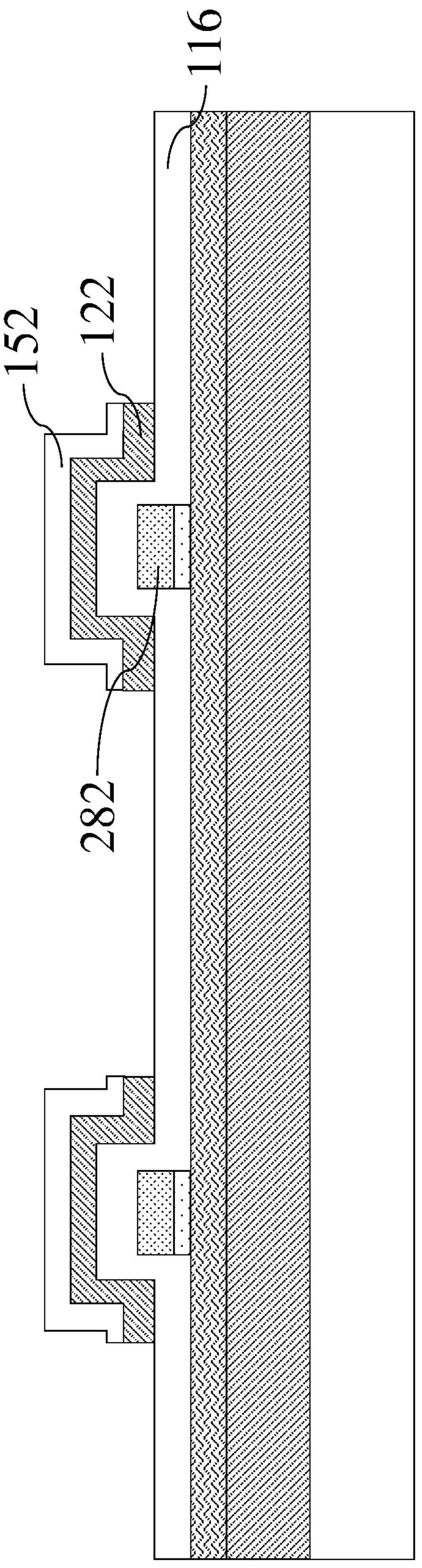

Referring to FIG. 15E, the blanket conductive layer 121 is patterned to form field plates 122 above the gate electrode 264. The field plates 122 have a profile similar to that of the mask layer 150 such that the field plates 122 can laterally span across the corresponding gate electrode 264. The patterning process can be performed by a wet etching process. During the wet etching process, the mask layer 152 can protect portions of the underlying blanket conductive layer 121. Accordingly, the portions of the blanket conductive layer 121 exposed from the openings of the mask layer 152 are removed. As afore-mentioned, the wet etching process can provide a high selectivity, so no over-etching would occur at the passivation layer 116 and thus the thickness of the passivation layer 116 can be kept the same or almost the same. In some embodiments, the blanket conductive layer 121 is made of TiN and the passivation layer 116 is made of Si3N4, such that they can have a high selectivity with respect to the same etchant during a wet etching process.

Figure 15F:
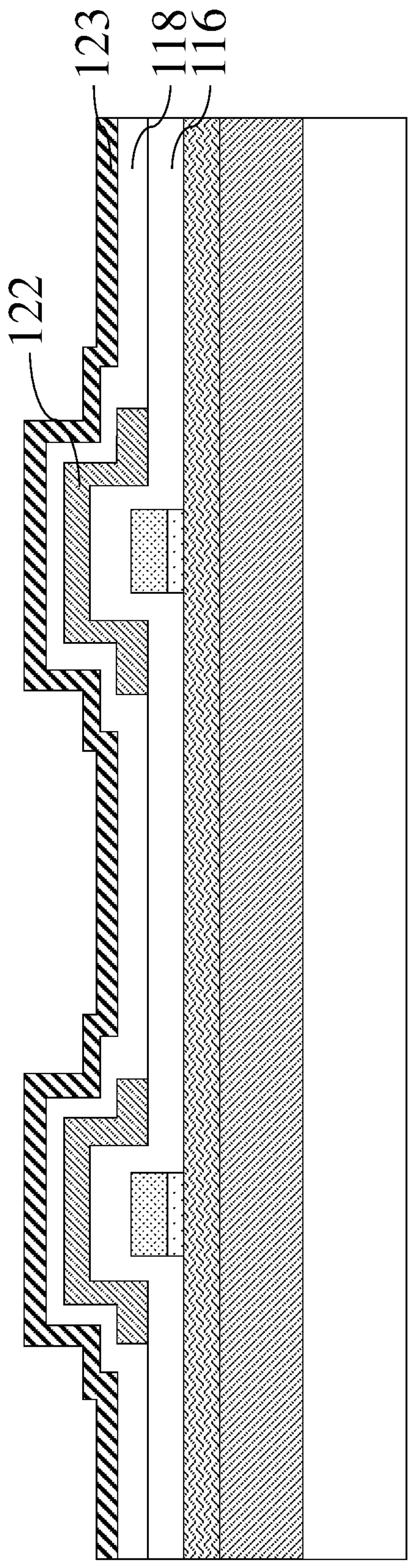

Referring to FIG. 15F, the mask layer 152 is removed. Then, a passivation layer 118 and a blanket conductive layer 123 can be formed over the passivation layer 116 and the field plates 122 in sequence by using the above-mentioned deposition techniques. The passivation layer 118 can be formed to cover the passivation layer 116 and the field plates 122. The blanket conductive layer 123 can be formed to cover the passivation layer 118.

Figure 15G:
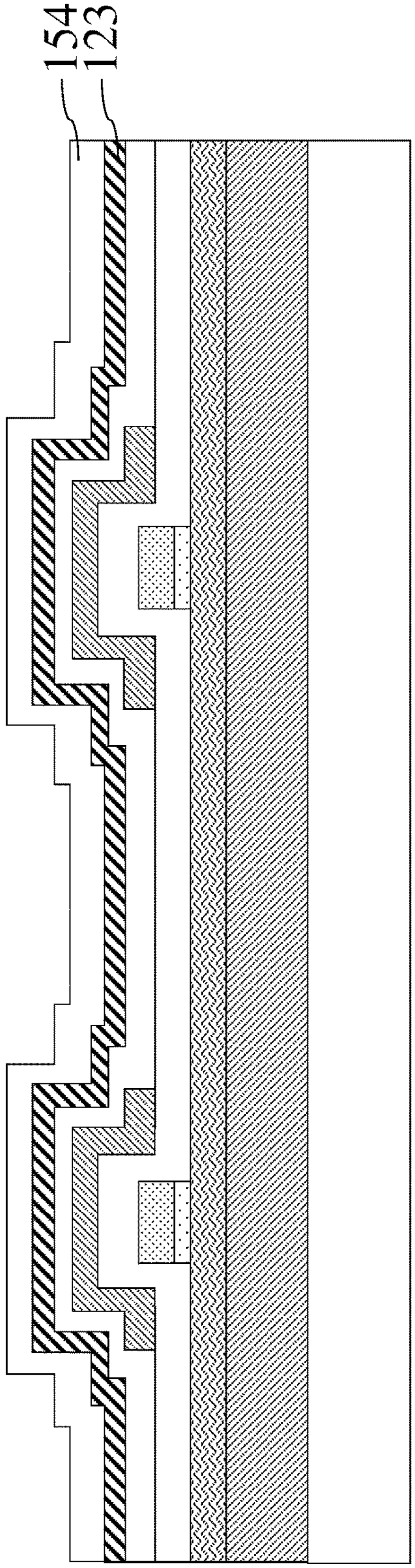

Referring to FIG. 15G, a mask layer 154 can be formed above/over/on the blanket conductive layer 123 by using the above-mentioned deposition techniques. The mask layer 154 can serve as a dry-etching mask for the blanket conductive layer 123 during patterning the same. In some embodiments, the blanket conductive layer 121 is made of TiN and the mask layer 154 is made of made of light-sensitive materials, such as a composition of a polymer, a sensitizer, and a solvent.

Figure 15H:
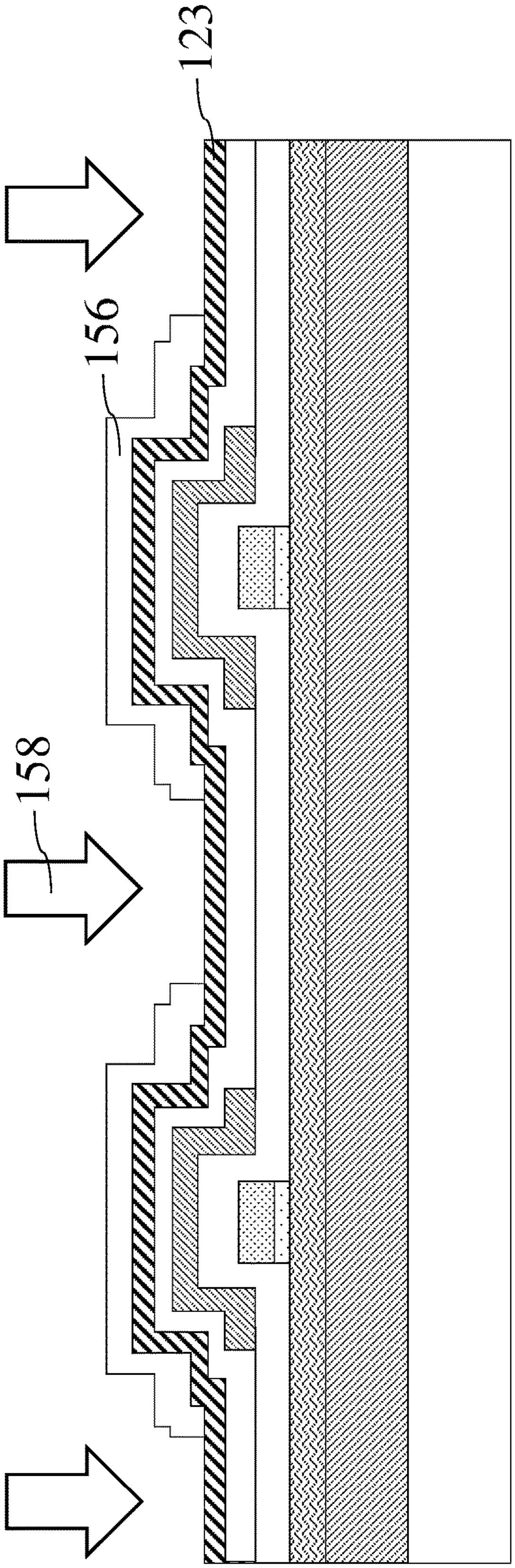

Referring to FIG. 15H, the mask layer 154 is patterned to form a mask layer 156 having openings. Some portions of the blanket conductive layer 123 are exposed from the openings of the mask layer 156. The profile of the mask layer 156 can be transferred to the blanket conductive layer 123 by performing a patterning process. In the exemplary illustration of FIG. 3H, the patterning process can be performed by using a dry etching process. For example, the dry etching process is a RIE process, which applies high-energy ions 158 from a plasma source to attack the exposed portions of the blanket conductive layer 123 and react with it for removing the same, so as to achieve patterning. After patterning, field plates 124 are formed from the blanket conductive layer 123.

Figure 15I:
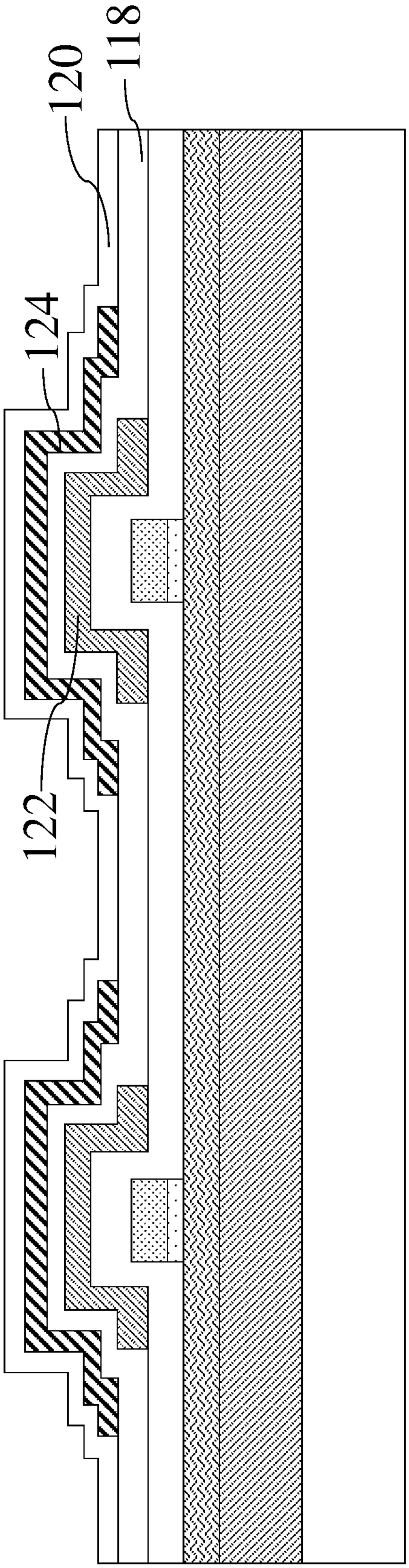

Referring to FIG. 15I, after patterning, the mask layer 156 is removed. The field plates 124 are formed above the field plate 122. The field plates laterally span across the field plate 122. Then, a passivation layer 120 can be formed over the passivation layer 118 and the field plates 124 by using the above-mentioned deposition techniques. The passivation layer 120 can be formed to cover the passivation layer 118 and the field plates 124.

Figure 15J:
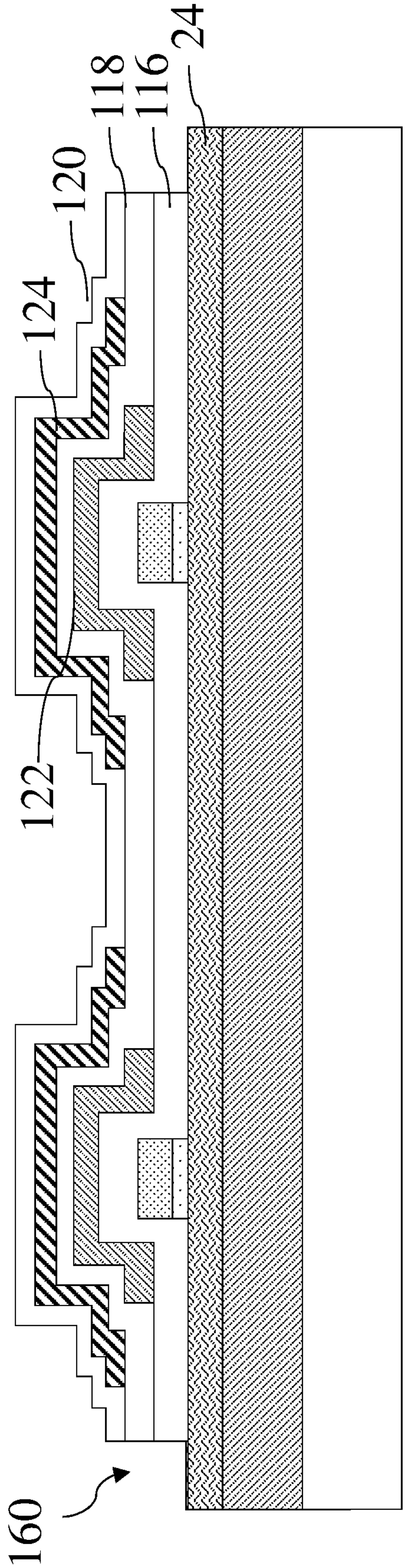

Referring to FIG. 15J, contact regions 160 are formed by removing some portions of the passivation layers 116, 118, 120. At least one portion of the nitride-based semiconductor layer 24 is exposed from the contact regions 160.

Figure 15K:
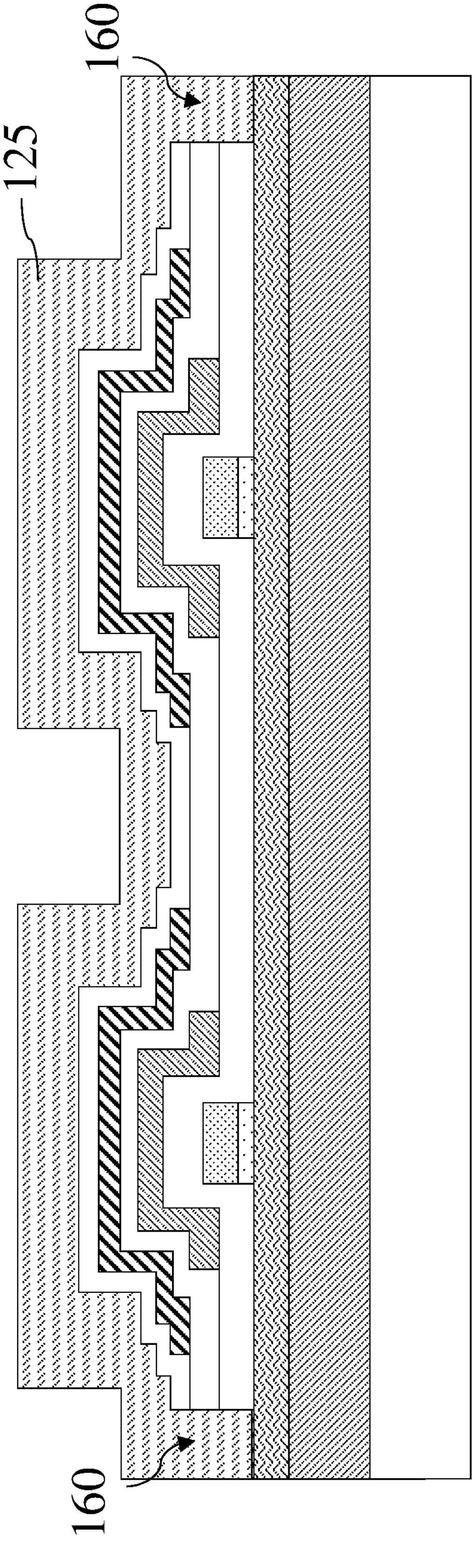

Referring to FIG. 15K, a blanket conductive layer 125 is formed above the resulted structure of FIG. 15J. The blanket conductive layer 125 is conformal with the resultant structure of FIG. 153J. The blanket conductive layer 125 is formed to cover the nitride-based semiconductor layer 24 and the passivation layers 116, 118, 120. The blanket conductive layer 125 is formed to fill the contact regions 160, thereby contacting with the nitride-based semiconductor layer 24. The next stage is patterning the blanket conductive layer 125. According to the desired requirements, the blanket conductive layer 125 can be patterned to have different profiles.

Figure 15L:
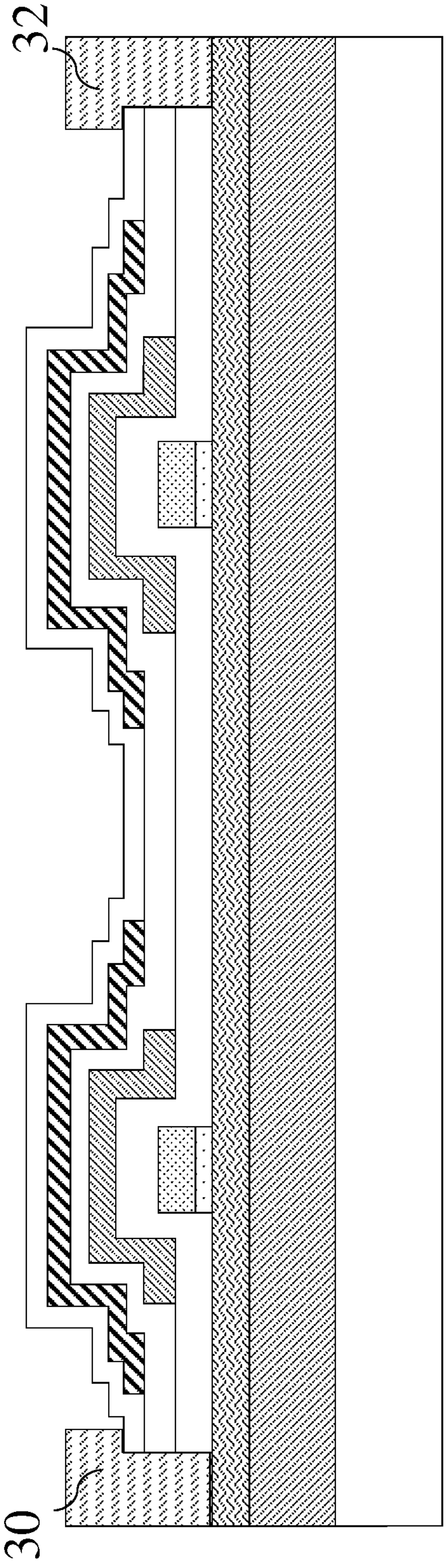

Referring to FIG. 15L, which shows one of the patterning results for the blanket conductive layer 125, source electrodes 30 and 32 are formed by patterning the blanket conductive layer 125. Some portions of the blanket conductive layer 125 are removed, and rest of the blanket conductive layer 125 within the contact regions 160 remains to serve as the source electrodes 30 and 32. In some embodiments, an entirety of the source electrodes 30 and 32 (i.e., the remaining blanket conductive layer 125) is lower than the passivation layer 120. In some embodiments, the blanket conductive layer 125 can be formed to be thicker, such that the source electrodes 30 and 32 (i.e., the remaining blanket conductive layer 125) is in a position higher than the passivation layer 120.

After the stage of FIG. 15L, the follow-up processes can be performed for forming passivation layers, vias, and patterned conductive layers over the resultant structure, thereby obtaining the structure as afore described.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 m, within 30 m, within 20 m, within 10 m, or within 1 m of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based bidirectional switching device for working with a battery protection controller having a power input terminal, a discharge over-current protection (DO) terminal, a charge over-current protection (CO) terminal, a voltage monitoring (VM) terminal and a ground terminal, the nitride-based bidirectional switching device comprising:

- a nitride-based active layer disposed on a substrate;
- a nitride-based barrier layer disposed on the nitride-based active layer and having a bandgap greater than a bandgap of the nitride-based active layer;
- a plurality of spacer layers disposed above the nitride-based barrier layer, comprising at least a first spacer layer and a second spacer layer disposed above the nitride-based barrier layer; and
- a dual gate transistor comprising:
- a first and a second source electrodes disposed on the plurality of spacer layers, the first source electrode being configured for electrically connecting to a ground terminal of the battery protection controller and the second source electrode being configured for connecting to the VM terminal of the battery protection controller through a voltage monitoring resistor; and
- a first and a second gate structures disposed on the nitride-based barrier layer and laterally between the first and second source electrodes, the first gate structure including a first gate electrode configured for electrically connecting to the DO terminal of the battery protection controller and the second gate structure including a second gate electrode configured for electrically connecting to the CO terminal of the battery protection controller;
- a first lower field plate disposed on the first spacer layer, separated from the first gate structure and laterally spanning at least a part of the first gate structure; and
- a second lower field plate disposed on the first spacer layer, separated from the second gate structure and laterally spanning at least a part of the second gate structure, wherein the first and second lower field plates are laterally spaced apart from each other;
- a first upper field plate disposed on the second spacer layer; and
- a second upper field plate disposed on the second spacer layer, wherein the first and second upper field plates are laterally spaced apart from each other;
- wherein a distance from the first upper field plate to the second upper field plate is less than a distance from the first lower field plate to the second lower field plate;
- wherein the first lower field plate is laterally overlapped with the first gate structure for a distance less than entire length of the first gate structure, and laterally spans a first region which is directly adjacent to the first gate structure and between the first and second gate structures;
- wherein the second lower field plate is laterally overlapped with the second gate structure for a distance less than entire length of the second gate structure, and laterally spans a second region which is directly adjacent to the second gate structure and between the first and second gate structures.

2. The nitride-based bidirectional switching device of claim 1, wherein

- the first upper field plate is separated from the first lower field plate and laterally spans at least a part of the first lower field plate and a region which is directly adjacent to the first lower field plate and between the first and second lower field plates; and
- the second upper field plate is separated from the second lower field plate and laterally spans at least a part of the second lower field plate and a region which is directly adjacent to the second lower field plate and between the first and second lower field plates, wherein the first and second upper field plates are laterally spaced apart from each other.

3. The nitride-based bidirectional switching device of claim 2, wherein a sidewall of the first lower field plate has a profile different than that of a sidewall of the first upper field plate, wherein a sidewall of the second lower field plate has a profile different than that of a sidewall of the second upper field plate.

4. The nitride-based bidirectional switching device of claim 2, wherein the first and second lower field plates have sidewalls extending upward from the first spacer layer and recessed inward to receive the second spacer layer.

5. The nitride-based bidirectional switching device of claim 2, wherein the first and second upper field plates have sidewalls being oblique.

6. The nitride-based bidirectional switching device of claim 2, wherein the first and second lower field plates have approximately the same thickness as those of the first and second upper second field plates.

7. The nitride-based bidirectional switching device of claim 2, wherein the first and second lower field plates have sidewalls with a first surface roughness, the first and second upper field plates have sidewalls with a second surface roughness which is greater than the first surface roughness.

8. The nitride-based bidirectional switching device of claim 2, wherein the first upper field plate is laterally overlapped with the first lower field plate for a distance equal to entire length of the first lower field plate, wherein the second upper field plate is laterally overlapped with the second lower field plate for a distance equal to entire length of the second lower field plate.

9. The nitride-based bidirectional switching device of claim 2, wherein the first upper field plate is laterally overlapped with the first lower field plate for a distance less than entire length of the first lower field plate, wherein the second upper field plate is laterally overlapped with the second lower field plate for a distance less than entire length of the second lower field plate.

10. The nitride-based bidirectional switching device of claim 2, wherein the first upper field plate is laterally overlapped with the first gate structure for a distance equal to entire length of the first gate structure, wherein the second upper field plate is laterally overlapped with the second gate structure for a distance equal to entire length of the second gate structure.

11. The nitride-based bidirectional switching device of claim 2, wherein the first upper field plate is laterally overlapped with the first gate structure for a distance less than entire length of the first gate structure, wherein the second upper field plate is laterally overlapped with the second gate structure for a distance less than entire length of the second gate structure.

12. A method for manufacturing a nitride-based bidirectional switching device, comprising:

forming a nitride-based active layer over a substrate;

forming a nitride-based barrier layer having a bandgap greater than a bandgap of the nitride-based active layer;

forming a first and a second gate electrodes over the nitride-based barrier layer;

forming a first passivation layer on the nitride-based barrier layer to cover the first and second gate electrodes;

forming a lower blanket field plate on the first passivation layer;

patterning the lower blanket field plate to respectively form a first and a second lower field plates above the first and second gate electrodes using a wet etching process;

forming a second passivation layer on the first passivation layer to cover the first and second lower field plates;

forming an upper blanket field plate on the second passivation layer; and patterning the upper blanket field plate to respectively form a first and a second upper field plates above the first and second lower field plates using a dry etching process;

wherein the first lower field plate is separated from the first gate electrode and laterally spanning at least a part of the first gate electrode; and the second lower field plate is separated from the second gate electrode and laterally spanning at least a part of the second gate electrode, wherein the first and second lower field plates are laterally spaced apart from each other;

wherein a distance from the first upper field plate to the second upper field plate is less than a distance from the first lower field plate to the second lower field plate;

wherein the first lower field plate is laterally overlapped with the first gate electrode for a distance less than entire length of the first gate electrode, and laterally spans a first region which is directly adjacent to the first gate electrode and between the first and second gate electrodes;

wherein the second lower field plate is laterally overlapped with the second gate electrode for a distance less than entire length of the second gate electrode, and laterally spans a second region which is directly adjacent to the second gate electrode and between the first and second gate electrodes.

13. The method of claim 12, further comprising:

forming a third passivation layer to cover the first and second upper field plates.

14. The method of claim 13, further comprising:

forming a pair of first and second source electrodes over the nitride-based barrier layer, such that the first and second gate electrodes, the first and second lower field plate, and the first and second upper field plates are located between the first and second source electrodes.

15. The method of claim 12, wherein patterning the lower blanket field plate is performed such that:

the first lower field plate laterally spans at least a part of the first gate electrode and a region which is directly adjacent to the first gate electrode and between the first and second gate electrodes;

the second lower field plate spans at least a part of the second gate electrode and a region which is directly adjacent to the second gate electrode and between the first and second gate electrodes; and the first and second lower field plates are laterally spaced apart from each other.

16. The method of claim 12, wherein patterning the upper blanket field plate is performed such that:

the first upper field plate spans at least a part of the first lower field plate and a region which is directly adjacent to the first lower field plate and between the first and second lower field plates;

the second upper field plate spans at least a part of the second lower field plate and a region which is directly adjacent to the second lower field plate and between the first and second lower field plates; and the first and second upper field plates are laterally spaced apart from each other.

* * * * *